(12) United States Patent
Boire

(10) Patent No.: US 10,530,312 B2
(45) Date of Patent: Jan. 7, 2020

(54) RF POWER AMPLIFIER

(71) Applicant: BAE SYSTEMS INFORMATION AND ELECTRONIC SYSTEMS INTEGRATION INC., Nashua, NH (US)

(72) Inventor: Daniel C. Boire, Nashua, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 15/857,928

(22) Filed: Dec. 29, 2017

(65) Prior Publication Data

US 2019/0207566 A1 Jul. 4, 2019

(51) Int. Cl.
| | |
|---|---|
| H03F 3/68 | (2006.01) |
| H03F 1/42 | (2006.01) |
| H03F 3/21 | (2006.01) |
| H03F 1/56 | (2006.01) |
| H03F 3/19 | (2006.01) |

(52) U.S. Cl.
CPC ............ *H03F 1/42* (2013.01); *H03F 1/56* (2013.01); *H03F 3/19* (2013.01); *H03F 3/211* (2013.01); *H03F 2200/423* (2013.01); *H03F 2200/451* (2013.01)

(58) Field of Classification Search
CPC ..... H03F 1/42; H03F 3/19; H03F 3/211; H03F 1/56
USPC ............... 330/295, 124 R, 302, 305, 84, 286
See application file for complete search history.

(56) References Cited

U.S. PATENT DOCUMENTS

| | | | |
|---|---|---|---|
| 6,621,347 B2 * | 9/2003 | Morimoto | H03F 3/193 330/286 |
| 2010/0244981 A1 * | 9/2010 | Gorbachov | H03H 7/48 333/124 |
| 2017/0126181 A1 * | 5/2017 | Embar | H03F 1/0288 |

* cited by examiner

*Primary Examiner* — Khanh V Nguyen
*Assistant Examiner* — Khiem D Nguyen
(74) *Attorney, Agent, or Firm* — Sand, Sebolt & Wernow LPA; Scott J. Asmus

(57) ABSTRACT

An RF power amplifier includes an input coupler including a first resistor and a first capacitor, an input phase difference network of the input coupler including a first input direct current (DC) bias injection network and a second capacitor connected in series with the first resistor. The second capacitor increases a bandwidth of the RF power amplifier. The RF power amplifier may further include a first power amplifier and a second power amplifier. The first input DC bias injection network provides power to the first power amplifier and the second power amplifier. The RF power amplifier includes a lateral dimension narrower than a lateral dimension of an RF power amplifier comprising bias circuitry on two opposing sides.

19 Claims, 15 Drawing Sheets

RF POWER AMPLIFIER

BACKGROUND

Technical Field

The present disclosure relates to systems and methods for radio frequency (RF) power combining. More particularly, the present disclosure relates to RF or microwave power amplifiers. Specifically, the present disclosure relates to RF or microwave power amplifiers including an increased bandwidth and a reduced lateral dimension.

Background Information

Generally, increasing the output power capability of a radio frequency (RF) or microwave power amplifier typically requires the use of transistors with larger current and/or voltage handling capability. Extending this approach in an RF power amplifier design over wide bandwidths has practical limits in that large transistors are typically difficult to impedance match resulting in a loss of achievable gain, efficiency, and bandwidth.

Generally, power combining RF or microwave amplifiers with optimally sized transistors for efficiency using couplers is typically used to reach specified output power level goals. Typically, the size of the resultant power combined amplifier is nominally twice that of a single amplifier plus the size of the power combiners. Many applications of RF or microwave power amplifiers are space constrained in one or more dimensions which in turn may limit the output power capability of the amplifier in an application. A need exists for high efficiency wideband RF or microwave power amplifiers with increased bandwidth and significantly reduced size in one or more dimensions.

SUMMARY

Issues continue to exist with RF or microwave power amplifiers. One of the issues is a need for an RF or microwave power amplifier including an increased bandwidth and a reduced lateral dimension. The present disclosure addresses these and other issues.

In one aspect, the present disclosure may provide an RF power amplifier comprising an input coupler including a first resistor and a first capacitor, an input phase difference network of the input coupler including a first input direct current (DC) bias injection network and a second capacitor connected in series with the first resistor; wherein the second capacitor increases a bandwidth of the RF power amplifier. The RF power amplifier may further include a first power amplifier and a second power amplifier; wherein the first input DC bias injection network provides power to the first power amplifier and the second power amplifier.

The RF power amplifier may include a bandwidth ratio of at least approximately 4:1.

The RF power amplifier may further include an output coupler including a second resistor and a third capacitor and an output phase difference network of the output coupler including a first output DC bias injection network, a second output DC bias injection network and a fourth capacitor connected in series with the second resistor. The first input DC bias injection network may be on a first side of the RF power amplifier and the first output DC bias injection network and the second output DC bias injection network are on an opposing side.

The RF power amplifier may further include an output coupler including a second resistor and a third capacitor and an output phase difference network of the output coupler including a first output DC bias injection network, a second output DC bias injection network and a fourth capacitor connected in series with the second resistor. The first input DC bias injection network may be on a first side of the RF power amplifier and the first output DC bias injection network and the second output DC bias injection network are on the first side of the RF power amplifier.

The RF power amplifier may further include a lateral dimension narrower than a lateral dimension of an RF power amplifier comprising bias circuitry on two opposing sides.

The RF power amplifier may further include at least one RF path crossing of the first input DC bias injection network.

The RF power amplifier may further include a first node of the input coupler, an RF input port of the input coupler, an input of the first amplifier and an input of the second amplifier. The first node may be connected between the RF input port of the input coupler, the input of the first amplifier and the input of the second amplifier. The at least one RF path crossing may be positioned between the RF input port of the input coupler and the first node.

The RF power amplifier may further include a first node of the input coupler, an RF input port of the input coupler, an input of the first amplifier and an input of the second amplifier. The first node may be connected between the RF input port of the input coupler, the input of the first amplifier and the input of the second amplifier. One of the at least one RF path crossing may be positioned between the first node and the RF input port of the first amplifier and one of the at least one RF path crossing may be positioned between the first node and the input of the second amplifier.

The RF power amplifier may further include a second input DC bias injection network, at least one RF path crossing of the first input DC bias injection network and at least one RF path crossing of the second input DC bias injection network. The first input DC bias injection network may provide power to the first amplifier and the second input DC bias injection network may provide power to the second amplifier.

The RF power amplifier may further include a first node of the input coupler, an RF input port of the input coupler, an input of the first amplifier and an input of the second amplifier. The first node may be connected between the RF input port of the input coupler, the input of the first amplifier and the input of the second amplifier. One of the at least one RF path crossing of the first input DC bias injection network may be positioned between the first node and the RF input port of the first amplifier. One of the at least one RF path crossing of the first input DC bias injection network may be positioned between the first node and the input of the second amplifier. One of the at least one RF path crossing of the second input DC bias injection network may be positioned between the first node and the input of the first amplifier. One of the at least one RF path crossing of the second input DC bias injection network may be positioned between the first node and the input of the second amplifier.

In another aspect, the present disclosure may provide an RF power amplifier including a first node, a second node, a third node, a fourth node, a fifth node, a sixth node, a seventh node, a first ground, a second ground, an RF input port of the input coupler, the first capacitor connected between the RF input port of the input coupler and the first node, a first transmission line connected between the first node and the second node, a second transmission line connected between the first node and the third node, the second capacitor connected between the second node and the first resistor, the first resistor connected between the second capacitor and the third node, a third transmission line connected between the second node and the first amplifier, a third capacitor connected between the fourth node and the fifth node, a first inductor connected between the fourth node and the sixth node, a first DC bias injection port of the first input DC bias injection network connected to the sixth node, the sixth node connected to the seventh node, a fourth capacitor connected between the sixth node and the first ground, a second inductor connected between the fifth node and the seventh node, a fifth capacitor connected between the seventh node and the second ground, the first amplifier connected to the third transmission line and the second amplifier connected to the fifth node.

The RF power amplifier may further include an eighth node, a ninth node, a tenth node, an eleventh node, a twelfth node, a thirteenth node, a fourteenth node, a third ground, a fourth ground, an output coupler including an RF output port, a second resistor and a sixth capacitor, the sixth capacitor connected between the RF output port of the output coupler and the eighth node, an output phase difference network of the output coupler including a first output DC bias injection network, a second output DC bias injection network and a seventh capacitor, the seventh capacitor connected in series with the second resistor between the tenth node and the second resistor, a fourth transmission line connected between the eighth node and the tenth node, a fifth transmission line connected between the eighth node and the ninth node, the second resistor connected between the seventh capacitor and the ninth node, a sixth transmission line connected between the tenth node and the second amplifier, an eighth capacitor connected between the eleventh node and the twelfth node, a third inductor connected between the eleventh node and the thirteenth node, a third DC bias injection port of the second output DC bias injection network connected to the thirteenth node, a fourth DC bias injection port of the second output DC bias injection network connected to the fourteenth node, a ninth capacitor connected between the thirteenth node and the third ground, a fourth inductor connected between the twelfth node and the fourteenth node, a tenth capacitor connected between the fourteenth node and the fourth ground, the first amplifier connected to the twelfth node and the second amplifier connected to the sixth transmission line.

In another aspect, the present disclosure may provide an RF power amplifier including an input coupler including a first resistor and a first capacitor, an input phase difference network of the input coupler including a first input direct current (DC) bias injection network and a second capacitor connected in series with the first resistor. The second capacitor increases a bandwidth of the RF power amplifier. The RF power amplifier may further include a first power amplifier and a second power amplifier. The first input DC bias injection network provides power to the first power amplifier and the second power amplifier. The RF power amplifier may further include a lateral dimension narrower than a lateral dimension of an RF power amplifier comprising bias circuitry on two opposing sides.

BRIEF DESCRIPTION OF THE SEVERAL VIEWS OF THE DRAWINGS

Sample embodiments of the present disclosure are set forth in the following description, is shown in the drawings and is particularly and distinctly pointed out and set forth in the appended claims.

Similar numbers refer to similar parts throughout the drawings.

DETAILED DESCRIPTION

Figure 1:
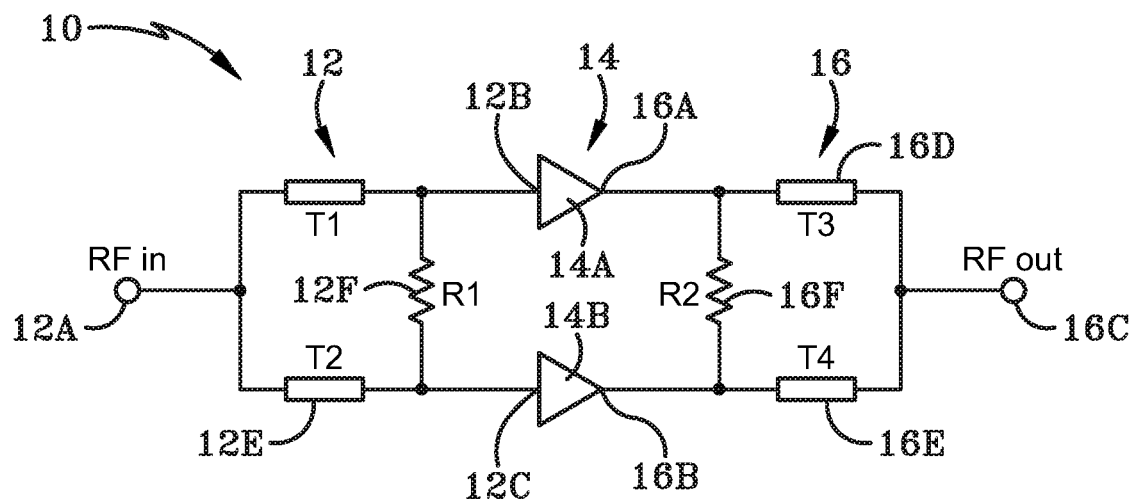
FIG. 1 is a schematic circuit diagram of a PRIOR ART radio frequency (RF) power amplifier.

FIG. 1 is a schematic circuit diagram of a PRIOR ART radio frequency (RF) power amplifier 10 which includes a first Wilkinson coupler 12, at least one amplification circuit 14 including a first amplifier 14A and a second amplifier 14B and a second Wilkinson coupler 16.

The first Wilkinson coupler 12 includes an RF input port 12A, a first output port 12B, a second output port 12C, a first nominally quarter wavelength transmission line 12D, a second nominally quarter wavelength transmission line 12E and a first resistor 12F connected between the first output port 12B and the second output port 12C. The first amplifier 14A includes an input and an output and the second amplifier 14B includes an input and an output. The second Wilkinson coupler 16 includes a first input port 16A, a second input port 16B, an output port 16C, a third nominally quarter wavelength transmission line 16D, a fourth nominally quarter wavelength transmission line 16E and a second resistor 16F connected between the first input port 16A and the second input port 16B.

Figure 2:
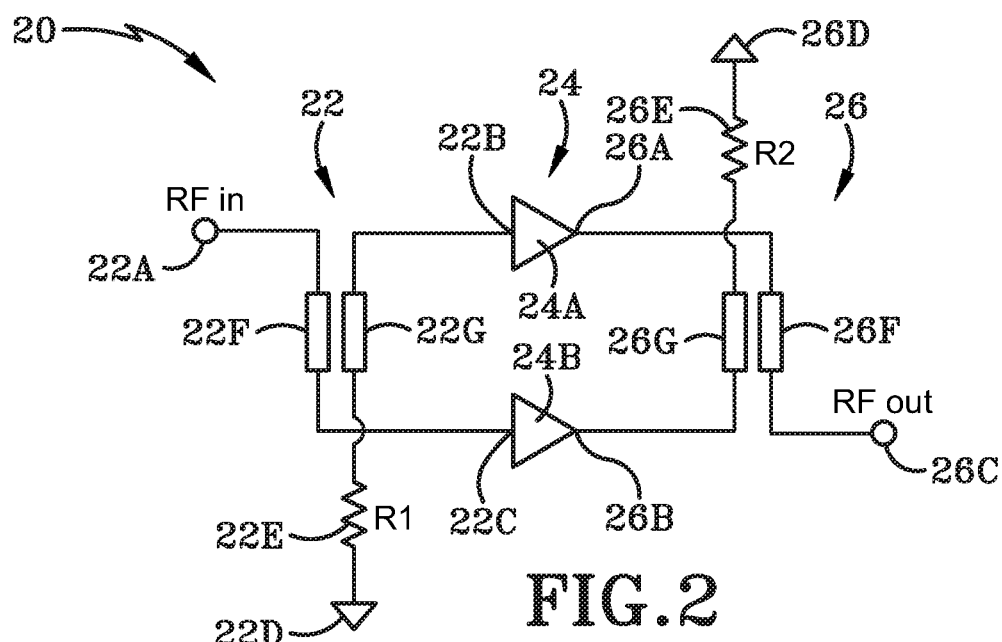
FIG. 2 is a schematic circuit diagram of a PRIOR ART RF power amplifier.

FIG. 2 is a schematic circuit diagram of a PRIOR ART RF power amplifier 20 which includes a first Lange coupler 22, at least one amplification circuit 24 including a first amplifier 24A and a second amplifier 24B and a second Lange coupler 26.

The first Lange coupler 22 includes an RF input port 22A, a first output port 22B, a second output port 22C, an isolated port 22D including a terminating resistor 22E, a first nominally quarter wavelength transmission line 22F connected with a second nominally quarter wavelength transmission line 22G. The first amplifier 24A includes an input and an output and the second amplifier 24B includes an input port 24E and an output. The second Lange coupler 26 includes a first input port 26A, a second input port 26B, an RF output port 26C, an isolated port 26D including a terminating resistor 26E, a third nominally quarter wavelength transmission line 26F connected with a fourth nominally quarter wavelength transmission line 26G.

Figure 3:
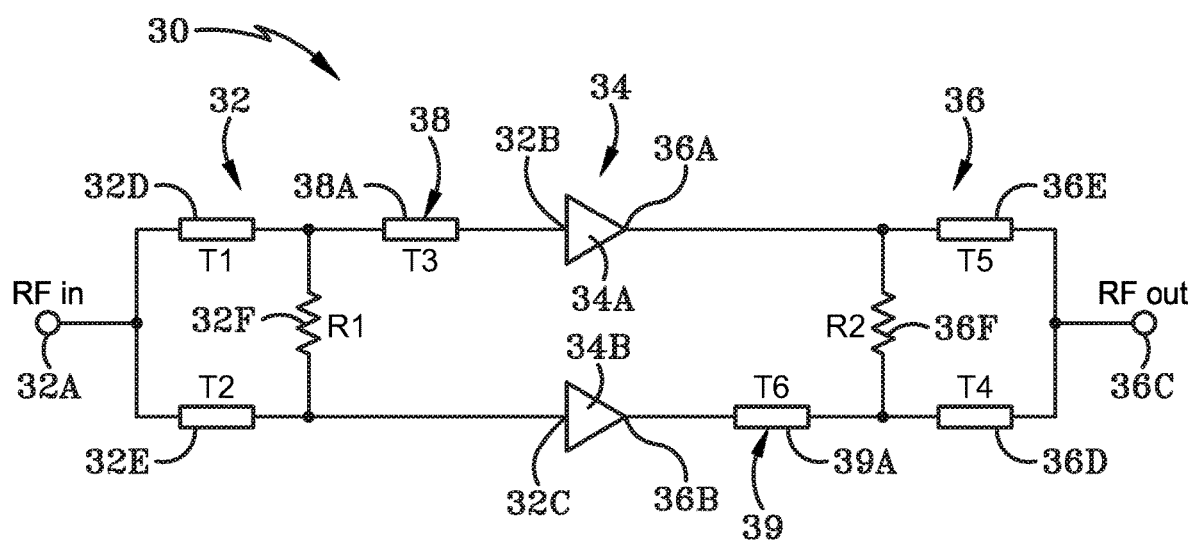
FIG. 3 is a schematic circuit diagram of a PRIOR ART RF power amplifier.

FIG. 3 is a schematic circuit diagram of a PRIOR ART radio frequency (RF) power amplifier 30 which includes a first offset Wilkinson coupler 32, at least one amplification circuit 34 including a first amplifier 34A and a second amplifier 34B and a second offset Wilkinson coupler 36.

The first offset Wilkinson coupler 32 includes an RF input port 32A, a first output port 32B, a second output port 32C, a first nominally quarter wavelength transmission line 32D, a second nominally quarter wavelength transmission line 32E, a first resistor 32F connected between the first output port 32B and the second output port 32C and a phase difference network 38 including a third nominally quarter wavelength transmission line 38A. The first amplifier 34A includes an input and an output and the second amplifier 34B includes an input and an output. The second offset Wilkinson coupler 36 includes a first input port 36A, a second input port 36B, an output port 36C, a fourth nominally quarter wavelength transmission line 36D, a fifth nominally quarter wavelength transmission line 36E, a second resistor 36F connected between the first input port 36A and the second input port 36B and a phase difference network 39 including a sixth nominally quarter wavelength transmission line 39A.

Exemplary disadvantages of the PRIOR ART RF power amplifiers 10, 20 and 30 are the resultant large size of the systems and the bias injection circuitry of the systems. The desired performance of the PRIOR ART RF power amplifiers 10, 20 and 30 are typically achieved with twice the area of a single amplifier which includes the size of the couplers utilized as well as the biasing circuitry necessary to make the system function properly. The bias injection circuitry typically utilizes large value inductors which are typically physically large in size and may have resonances or low isolation at some frequencies. Further, the bias injection circuitry must be replicated for each power combined amplifier in the PRIOR ART power amplifiers 10, 20 and 30. Further, a bandwidth ratio of the PRIOR ART RF power amplifiers is a maximum of approximately 3:1.

Figure 4:
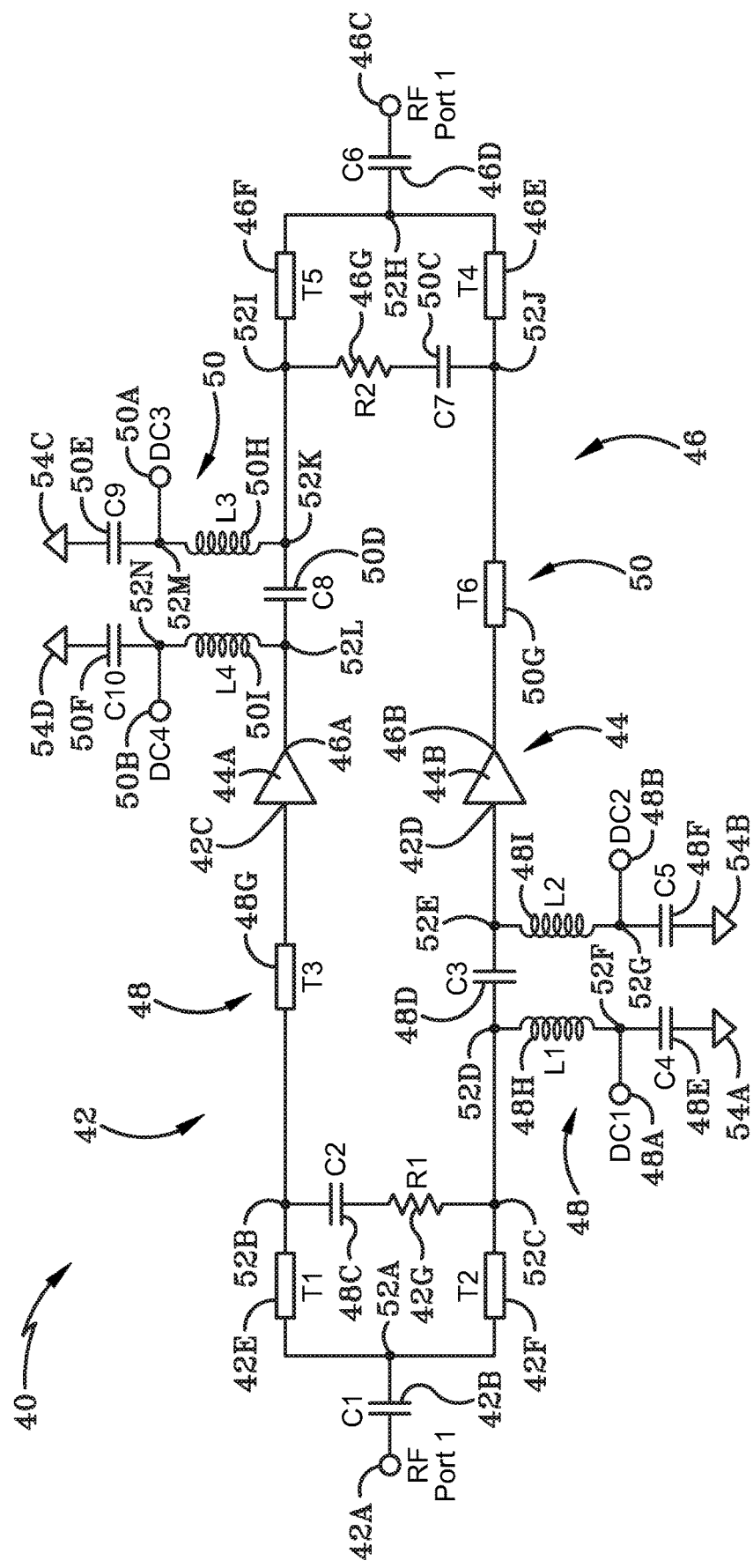
FIG. 4 is a schematic circuit diagram of an RF power amplifier in accordance with one aspect of the present disclosure.

FIG. 4 is a schematic circuit diagram of an RF power amplifier 40 in accordance with one aspect of the present disclosure. The RF power amplifier 40 may include a first, or input, coupler 42, an amplification circuit 44 including a first amplifier 44A and a second amplifier 44B and a second, or output, coupler 46.

The first coupler 42 may include an RF input port 42A, a first capacitor 42B, a first output port 42C, a second output port 42D, a first nominally quarter wavelength transmission line 42E, a second nominally quarter wavelength transmission line 42F, a first resistor 42G connected between the first output port 42C and the second output port 42D, and an input, or first, phase difference network 48.

The input phase difference network 48 may include a first input DC bias injection port 48A, which is sometimes referred to as first DC bias injection port, a second input DC bias injection port 48B, which is sometimes referred to as second DC bias injection port, a second capacitor 48C, a third capacitor 48D, a fourth capacitor 48E, a fifth capacitor 48F, a third nominally quarter wavelength transmission line 48G, a first inductor 48H and a second inductor 48I.

The second coupler 46 may include a first input port 46A, a second input port 46B, an RF output port 46C, a sixth capacitor 46D, a fourth nominally quarter wavelength transmission line 46E, a fifth nominally quarter wavelength transmission line 46F, a second resistor 46G connected between the first input port 46A and the second input port 46B and an output, or second, phase difference network 50.

The output phase difference network 50 may include a first output DC bias injection port 50A, which is sometimes referred to as third DC bias injection port, a second output DC bias injection port 50B, which is sometimes referred to as fourth DC bias injection port, a seventh capacitor 50C, an eighth capacitor 50D, a ninth capacitor 50E, a tenth capacitor 50F, a sixth nominally quarter wavelength transmission line 50G, a third inductor 50H and a fourth inductor 50I.

The RF power amplifier 40 may further include a first node 52A, a second node 52B, a third node 52C, a fourth node 52D, a fifth node 52E, a sixth node 52F, a seventh node 52G, an eighth node 52H, a ninth node 52I, a tenth node 52J, an eleventh node 52K, a twelfth node 52L, a thirteenth node 52M and a fourteenth node 52N. The RF power amplifier 40 may further include a first ground 54A, a second ground 54B, a third ground 54C and a fourth ground 54D.

With continued reference to FIG. 4, the first capacitor 42B may be connected between the RF input port 42A of the first coupler 42 and the first node 52A. The first transmission line 42E may be connected between the first node 52A and the second node 52B. The second transmission line 42F may be connected between the first node 52A and the third node 52C. The second capacitor 48C may be connected between the second node 52B and the first resistor 42G. The first resistor 42G may be connected between the second capacitor 48C and the third node 52C. The third transmission line 48G may be connected between the second node 52B and the first output port 42C of the first coupler 42. The third capacitor 48D may be connected between the fourth node 52D and the fifth node 52E. The first inductor 48H may be connected between the fourth node 52D and the sixth node 52F.

The first input DC bias injection port 48A may be connected to the sixth node 52F. The fourth capacitor 48E may be connected between the sixth node 52F and the first ground 54A. The second inductor 48I may be connected between the fifth node 52E and the seventh node 52G. The second input DC bias injection port 48B may be connected to the seventh node 52G. The fifth capacitor 48F may be connected between the seventh node 52G and the second ground 54B. The first amplifier 44A may be connected to the third transmission line 48G and the second amplifier 44B may be connected to the fifth node 52E.

With continued reference to FIG. 4, the sixth capacitor 46D may be connected between the RF output port 46C of the second coupler 46 and the eighth node 52H. The fourth transmission line 46E may be connected between the eighth node 52H and the tenth node 52J. The fifth transmission line 46F may be connected between the eighth node 52H and the ninth node 52I. The seventh capacitor 50C may be connected between the tenth node 52J and the second resistor 46G. The second resistor 46G may be connected between the seventh capacitor 50C and the ninth node 52I. The sixth transmission line 50G may be connected between the tenth node 52J and the second input port 46B of the second coupler 46. The eighth capacitor 50D may be connected between the eleventh node 52K and the twelfth node 52L. The third inductor 50H may be connected between the thirteenth node 52M and the eleventh node 52K.

The first output DC bias injection port 50A may be connected to the thirteenth node 52M. The ninth capacitor 50E may be connected between the thirteenth node 52M and the third ground 54C. The third inductor 50H may be connected between the eleventh node 52K and the thirteenth node 52M. The second output DC bias injection port 50B may be connected to the fourteenth node 52N. The tenth capacitor 50F may be connected between the fourteenth node 52N and the fourth ground 54D. The fourth inductor 50I may be connected between the twelfth node 52L and the fourteenth node 52N. The first amplifier 44A may be connected to the twelfth node 52L and the second amplifier 44B may be connected to the sixth transmission line 50G.

Figure 4A:
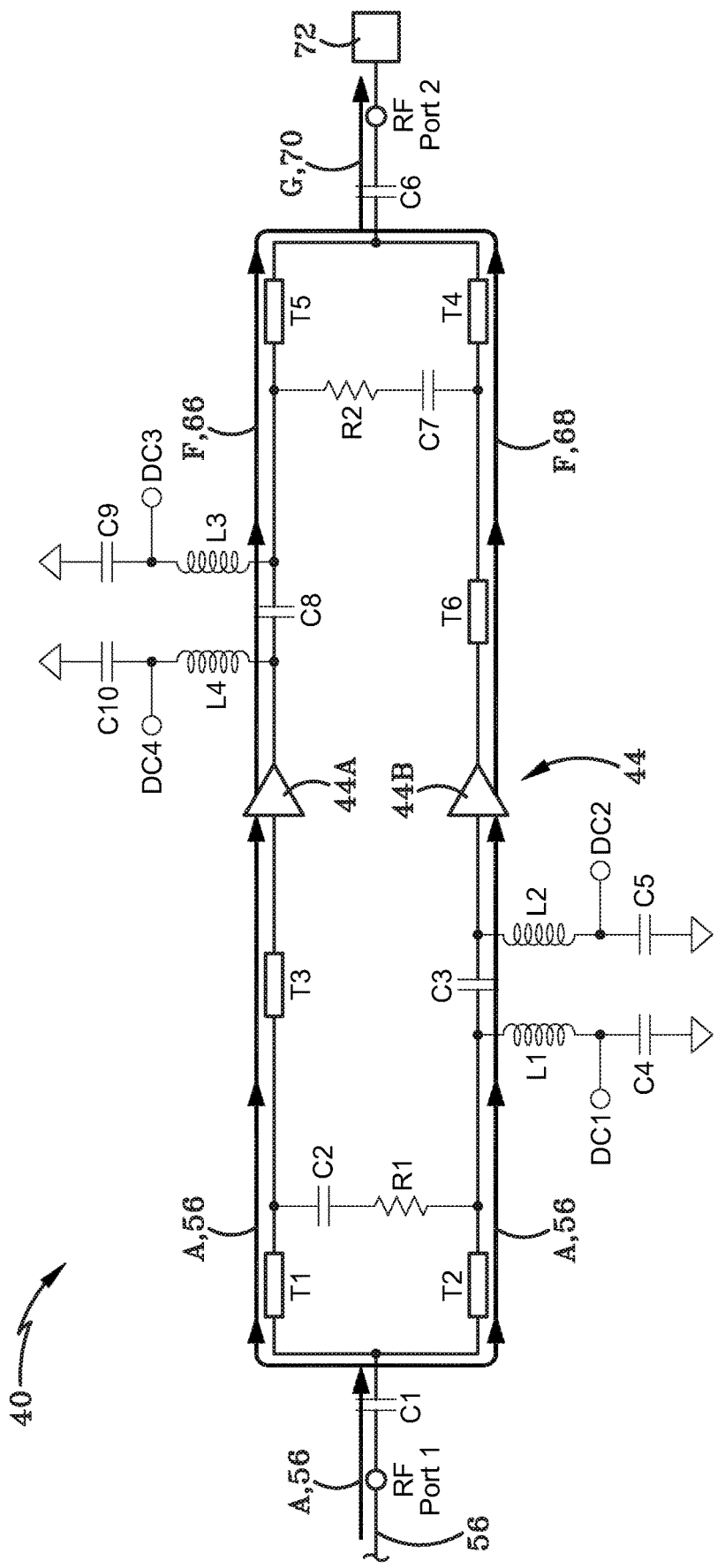
FIG. 4A is a schematic circuit diagram of one embodiment of the RF power amplifier with some of the reference numerals removed to show the operation of the RF power amplifier.

Reference is made to FIG. 4, FIG. 4A, FIG. 4B and FIG. 4C, which are schematic circuit diagrams of the RF power amplifier 40 with some of the reference numerals removed, to show the operation of the RF power amplifier 40. In operation, an RF input signal 56 (FIG. 4A) enters the input port 42A of the first coupler 42 and travels along a signal path represented by arrow A (FIG. 4A). The input signal 56 passes through the first capacitor 42B. In one example, the first capacitor 42B may be a DC blocking capacitor and may also be utilized for impedance matching.

The input signal 56 travels from the first capacitor 42B along arrow A to the first transmission line 42E and the second transmission line 42F. The first transmission line 42E and the second transmission line 42F may be nominally quarter wavelength transmission lines; however, any suitable transmission lines may be utilized. In one example, the first transmission line 42E and the second transmission line 42F may be realized as inductors in a monolithic microwave integrated circuit (MMIC) to reduce the amount of space required for the components of the RF power amplifier 40.

The first transmission line 42E and the second transmission line 42F split the input signal 56 so that one half of the input signal 56 travels through the first transmission line 42E and the other half of the input signal 56 travels through the second transmission line 42F (FIG. 4A). The portion of the signal that travels through the first transmission line 42E travels along the signal path represented by arrow A to the third transmission line 48G. The third transmission line 48G produces a phase shift in the signal. In one example, the phase shift is approximately 45 degrees; however, the phase shift may be any suitable phase shift. The phase-shifted signal then travels to the first output port 42C of the first coupler 42 to the input of the first amplifier 44A.

Figure 4B:
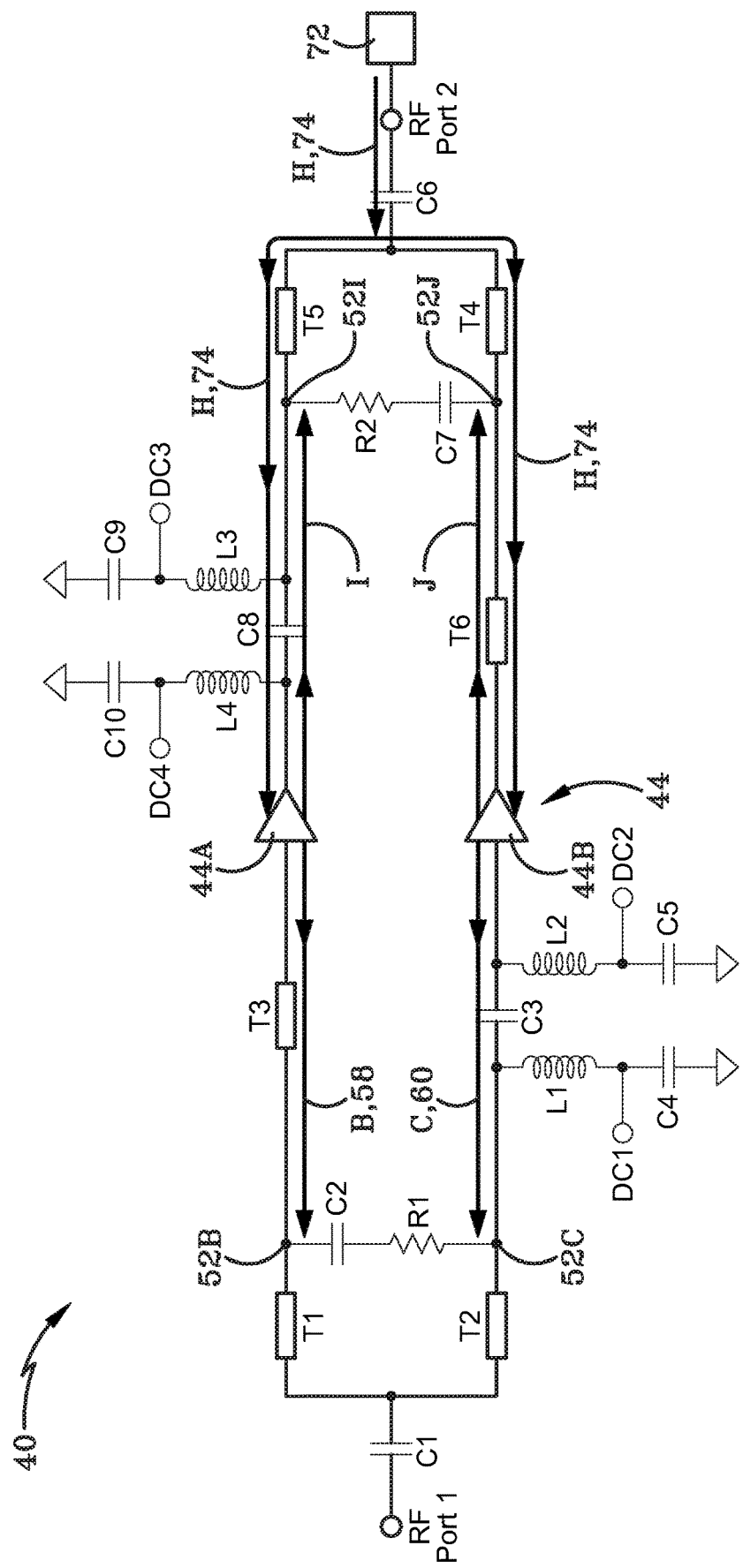
FIG. 4B is a schematic circuit diagram of one embodiment of the RF power amplifier with some of the reference numerals removed to show the operation of the RF power amplifier.

In one example, a first reflected signal 58 may be reflected from the first amplifier 44A (FIG. 4B). The first reflected signal 58 travels along a signal path represented by arrow B (FIG. 4B). The first reflected signal 58 travels from the input of the first amplifier 44A through the first output port 42C of the first coupler 42 to the third transmission line 48G. The third transmission line 48G produces a phase shift in the first reflected signal 58. In one example, the phase shift is approximately 45 degrees; however, the phase shift may be any suitable phase shift. Therefore, the first reflected signal 58 may be 90 degrees out of phase as it travels towards the second node 52B.

The portion of the signal that travels through the second transmission line 42F travels along the signal path represented by arrow A across the third node 52C, across the fourth node 52D, across the third capacitor 48D and across the fifth node 52E to the second output port 42D of the first coupler 42 to the input of the second amplifier 44B (FIG. 4A). The third capacitor 48D, the first inductor 48H and the second inductor 48I produce a phase shift in the signal. In one example, the phase shift is approximately −45 degrees; however, the phase shift may be any suitable phase shift.

In one example, a second reflected signal 60 may be reflected from the second amplifier 44B (FIG. 4B). The second reflected signal 60 travels along a signal path represented by arrow C (FIG. 4B). The second reflected signal 60 travels from the input of the second amplifier 44B across the fifth node 52E, across the third capacitor 48D, across the fourth node 52D to the third node 52C. The third capacitor 48D, the first inductor 48H and the second inductor 48I produce a phase shift in the second reflected signal 60. In one example, the phase shift is approximately −45 degrees; however, the phase shift may be any suitable phase shift. Therefore, the second reflected signal 60 may be −90 degrees out of phase as it travels towards the third node 52C.

In one example, the first reflected signal 58 is 90 degrees out of phase and the second reflected signal 60 is −90 degrees out of phase, and, therefore, the first reflected signal 58 and the second reflected signal 60 are cancelled across the first resistor 42G. The DC of the reflected signals 58 and 60 is blocked by the second capacitor 48C. In one example, the second capacitor 48C broadens the bandwidth of the system and also further reduces the suitable length of the first transmission line 42E and the second transmission line 42F which reduces the amount of space necessary for the architecture of the RF power amplifier 40. In one example, a bandwidth ratio of the RF power amplifier 40 is greater than at least approximately 4:1. In another example, the bandwidth ratio of the RF power amplifier 40 is greater than at least approximately 6:1

Thus, in one example, the first phase difference network 48 maintains a 90 degree phase difference between the split portions of the input signal 56 as they are transmitted to the first amplifier 44A and the second amplifier 44B and a 90 degree phase difference between the first reflected signal 58 and the second reflected signal 60 as the first reflected signal 58 and the second reflected signal 60 travel towards the first resistor 42G. Although the first phase difference network 48 may maintain a phase difference of 90 degrees, it is envisioned that other phase differences may be utilized for efficient combining.

Figure 4C:
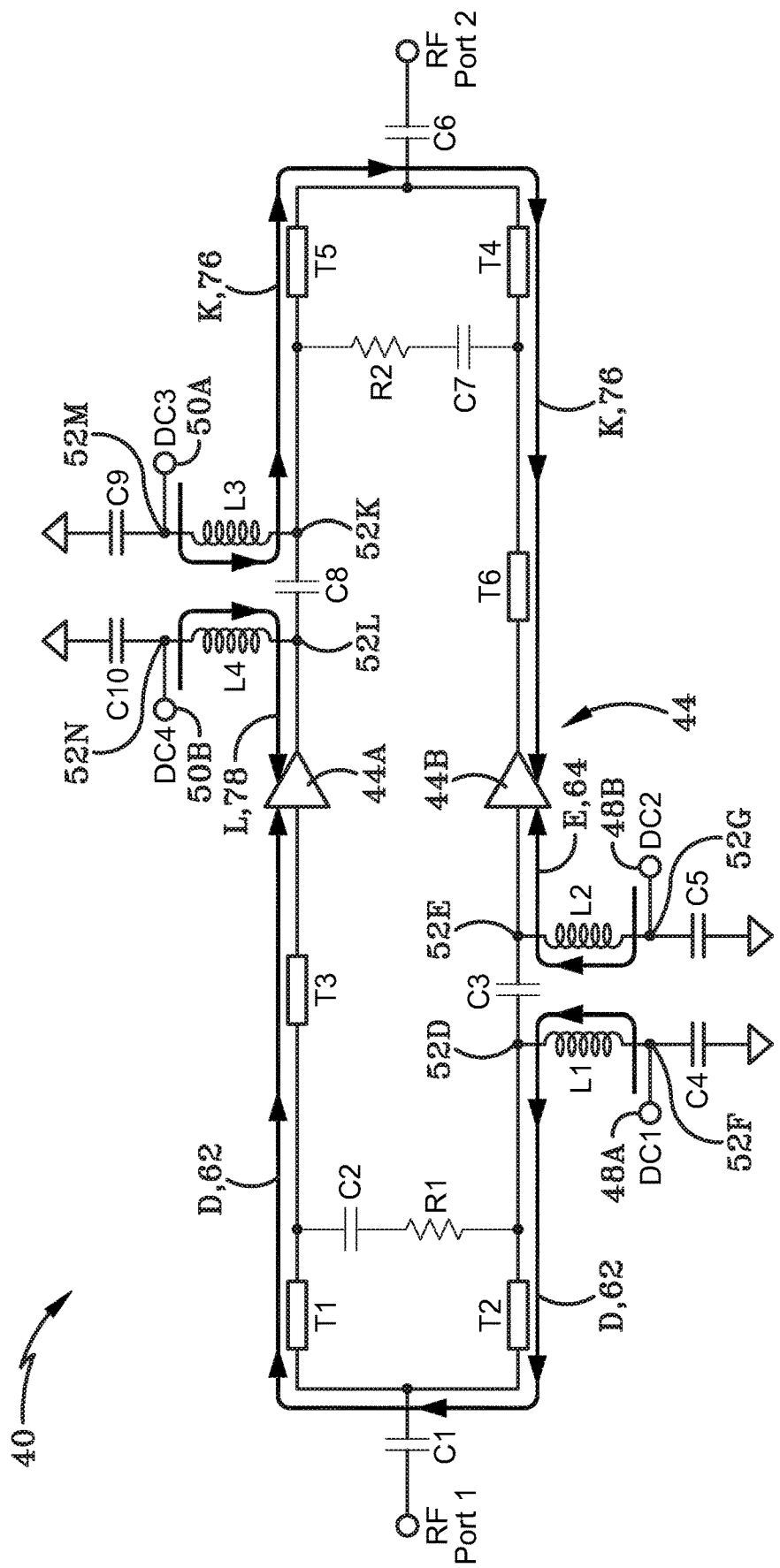
FIG. 4C is a schematic circuit diagram of one embodiment of the RF power amplifier with some of the reference numerals removed to show the operation of the RF power amplifier.

The first input DC bias injection port 48A of the first phase difference network 48 is connected to the first output port 42C of the first coupler 42 (FIG. 4C). The first input DC bias injection port 48A may provide a first bias signal 62 to the first amplifier 44A (FIG. 4C). The first bias signal 62 may be used to provide power to the first amplifier 44A. The first bias signal 62 may be any suitable bias signal. The first bias signal 62 travels along a signal path represented by arrow D (FIG. 4C). The first bias signal 62 travels across the sixth node 52F and across first inductor 48H since the first bias signal 62 cannot pass through the fourth capacitor 48E (FIG. 4C). In one example, the fourth capacitor 48E may be a large value capacitor which provides a DC open and an RF short within the circuit of the RF power amplifier 40. The first bias signal 62 travels across the fourth node 52D and travels towards the second transmission line 42F since the first bias signal 62 cannot pass through the third capacitor 48D. The first bias signal 62 travels across the second transmission line 42F, across the first node 52A and towards the first transmission line 42E since the first bias signal 62 cannot pass through the first capacitor 42B. The first bias signal 62 travels through the first transmission line 42E, across the second node 52B, through the third transmission line 48G and through the first output port 42C of the first coupler 42 to the input of the first amplifier 44A (FIG. 4C).

The second input DC bias injection port 48B of the first phase difference network 48 is connected to the second output port 42D of the first coupler 42 (FIG. 4C). The second input DC bias injection port 48B may provide a second bias signal 64 to the second amplifier 44B. The second bias signal 64 may be used to provide power to the second amplifier 44B. The second bias signal 64 may be any suitable bias signal. The second bias signal 64 travels along a signal path represented by arrow E (FIG. 4C). The second bias signal 64 travels across the seventh node 52G and across the second inductor 48I since the second bias signal 64 cannot pass through the fifth capacitor 48F. In one example, the fifth capacitor 48F may be a large value capacitor which provides a DC open and an RF short within the circuit of the RF power amplifier 40. The second bias signal 64 travels across the fifth node 52E and travels through the second output port 42D of the first coupler 42 to the input of the second amplifier 44B (FIG. 4C).

With continued reference to FIG. 4, and in one example, the first input DC bias injection port 48A and the second input DC bias injection port 48B are positioned on one side of the RF power amplifier 40 and generally adjacent to one another. This architecture configuration is beneficial as the first coupler 42 may be used to bias two power combined amplifiers 44A and 44B from the same side of the RF power amplifier 40 which reduces the amount of space needed for all of the components of the system. Further, the first inductor 48H and the second inductor 48I do not need to be RF chokes, which are generally inductors that may be used to block higher-frequency alternating current (AC) in an electrical circuit while passing lower-frequency or DC, which reduces losses and improves efficiency.

With reference to FIG. 4A, the portion of the input signal 56 that enters the input of the first amplifier 44A is amplified by the first amplifier 44A and a first amplified signal 66, which is still 45 degrees out of phase, travels along a signal path represented by arrow E. The portion of the input signal 56 that enters the input of the second amplifier 44B is amplified by the second amplifier 44B and a second amplified signal 68, which is still −45 degrees out pf phase, travels along a signal path represented by the arrow F (FIG. 4A).

The first amplified signal 66 travels across the twelfth node 52L, across the eighth capacitor 50D, across the eleventh node 52K, across the ninth node 52I, across the fifth transmission line 46F, to the eighth node 52H (FIG. 4A). The eighth capacitor 50D, the third inductor 50H and the fourth inductor 50I produce a phase shift in the first amplified signal 66. In one example, the phase shift is approximately −45 degrees; however, the phase shift may be any suitable phase shift. Therefore, the first amplified signal 66 may be 0 degrees out of phase as it travels towards the eighth node 52H.

The second amplified signal 68 travels through the sixth transmission line 50G, across the tenth node 52J, across the fourth transmission line 46E to the eighth node 52H (FIG. 4A). The sixth transmission line 50G produces a phase shift in the second amplified signal 68. In one example, the phase shift is approximately 45 degrees; however, the phase shift may be any suitable phase shift. Therefore, the second amplified signal 68 may be 0 degrees out of phase as it travels towards the eighth node 52H.

The first amplified signal 66 and the second amplified signal 68 are in phase and are combined across the eighth node 52H to form a combined signal 70 which travels across a signal path represented by arrow G (FIG. 4A). The combined signal 70 travels across the sixth capacitor 46D to the RF output port 46C of the second coupler 46. The RF output port 46C of the second coupler 46 may be connected with an antenna 72; however, the RF output port 46C of the second coupler 46 may be connected with any suitable device.

With reference to FIG. 4B, a third reflected signal 74 may be reflected from the antenna 72. The third reflected signal 74 travels along a signal path represented by arrow H. The third reflected signal 74 passes through the sixth capacitor 46D. In one example, the sixth capacitor 46D may be a DC blocking capacitor and may also be utilized for impedance matching.

The third reflected signal 74 travels from the sixth capacitor 46D along arrow H to the fourth transmission line 46E and the fifth transmission line 46F. The fourth transmission line 46E and the fifth transmission line 46F may be nominally quarter wavelength transmission lines; however, any suitable transmission lines may be utilized. In one example, the fourth transmission line 46E and the fifth transmission line 46F may be realized as inductors in a monolithic microwave integrated circuit (MMIC) to reduce the amount of space required for the components.

The fourth transmission line 46E and the fifth transmission line 46F split the third reflected signal 74 so that one half of the third reflected signal 74 travels through the fourth transmission line 46E and the other half of the third reflected signal 74 travels through the fifth transmission line 46F.

The portion of the signal that travels through the fourth transmission line 46E travels along the signal path represented by arrow H to the sixth transmission line 50G (FIG. 4B). The sixth transmission line 50G produces a phase shift in the signal. In one example, the phase shift is approximately 45 degrees; however, the phase shift may be any suitable phase shift. The phase-shifted signal then travels to the second input port 46B of the second coupler 46 to the output of the second amplifier 44B and is reflected back from the output of the second amplifier 44B and once again passes through the sixth transmission line 50G as shown by a signal path represented by arrow I. The sixth transmission line 50G produces a phase shift in the signal such that this portion of the third reflected signal 74 is now 90 degrees out of phase.

The portion of the signal that travels through the fifth transmission line 46F travels along the signal path represented by arrow H across the ninth node 52I, across the eleventh node 52K, across the eighth capacitor 50D and across the twelfth node 52L to the first input port 46A of the second coupler 46 to the output of the first amplifier 44A (FIG. 4B). The eighth capacitor 50D, the third inductor 50H and the fourth inductor 50I produce a phase shift in the signal. In one example, the phase shift is approximately −45 degrees; however, the phase shift may be any suitable phase shift. The phase-shifted signal then travels to the first input port 46A of the second coupler 46 to the output of the first amplifier 44A and is reflected back from the output of the second amplifier 44B and once again passes across the twelfth node 52L, the eighth capacitor 50D, and the eleventh node 52K as shown by a signal path represented by arrow J (FIG. 4B). The eighth capacitor 50D, the third inductor 50H and the fourth inductor 50I produce a phase shift in the signal such that this portion of the third reflected signal 74 is now −90 degrees out of phase.

In one example, one portion of the third reflected signal 74 is 90 degrees out of phase and the other portion of the third reflected signal 74 is −90 degrees out pf phase, and, therefore, both portions of the reflected signal 74 are cancelled across the second resistor 46G. The DC of both portions of the third reflected signal 74 is blocked by the seventh capacitor 50C. In one example, the seventh capacitor 50C broadens the bandwidth of the system and also further reduces the suitable length of the fourth transmission line 46E and the fifth transmission line 46F which reduces the amount of space necessary for the architecture of the RF power amplifier 40. Thus, in one example, the second phase difference network 50 maintains a 90 degree phase difference between the split portions of the third reflected signal 74 as they are reflected from the antenna 72 and a 90 degree phase difference between the split portions of the third reflected signal 74 as they are reflected from the first amplifier 44A and the second amplifier 44B towards the second resistor 46G. Although the second phase difference network 50 may maintain a phase difference of 90 degrees, it is envisioned that other phase differences may be utilized for efficient combining.

With reference to FIG. 4C, the first output DC bias injection port 50A of the second phase difference network 50 is connected to the second input port 46B of the second coupler 46. The first output DC bias injection port 50A may provide a third bias signal 76 to the second amplifier 44B. The third bias signal 76 may be used to provide power to the second amplifier 44B. The third bias signal 76 may be any suitable bias signal. The third bias signal 76 travels along a signal path represented by arrow K (FIG. 4C). The third bias signal 76 travels across the thirteenth node 52M and across third inductor 50H since the third bias signal 76 cannot pass through the ninth capacitor 50E. In one example, the ninth capacitor 50E may be a large value capacitor which provides a DC open and an RF short within the circuit. The third bias signal 76 travels across the eleventh node 52K and travels towards the fifth transmission line 46F since the third bias signal 76 cannot pass through the eighth capacitor 50D. The third bias signal 76 travels across the fifth transmission line 46F, across the eighth node 52H and towards the fourth transmission line 46E since the third bias signal 76 cannot pass through the sixth capacitor 46D. The third bias signal 76 travels through the fourth transmission line 46E, across the ninth node 52I, through the sixth transmission line 50G and through the second input port 46B of the second coupler 46 to the output of the second amplifier 44B.

With reference to FIG. 4C, the second output DC bias injection port 50B of the second phase difference network 50 is connected to the first input port 46A of the second coupler 46. The second output DC bias injection port 50B may provide a fourth bias signal 78 to the first amplifier 44A. The fourth bias signal 78 may be used to provide power to the first amplifier 44A. The fourth bias signal 78 may be any suitable bias signal. The fourth bias signal 78 travels along a signal path represented by arrow L (FIG. 4C). The fourth bias signal 78 travels across the fourteenth node 52N and across the fourth inductor 50I since the fourth bias signal 78 cannot pass through the tenth capacitor 50F. In one example, the tenth capacitor 50F may be a large value capacitor which provides a DC open and an RF short within the circuit. The fourth bias signal 78 travels across the eleventh node 52K and travels through the first input port 46A of the second coupler 46 to the output of the first amplifier 44A.

With reference to FIG. 4, and in one example, the first output DC bias injection port 50A and the second output DC bias injection port 50B are positioned on one side of the RF power amplifier 40 and generally adjacent to one another. This architecture configuration is beneficial as the second coupler 46 may be used to bias two power combined amplifiers 44A and 44B from the same side of the RF power amplifier 40 which reduces the amount of space needed for all of the components of the system. Further, the third inductor 50H and the fourth inductor 50I do not need to be RF chokes, which are generally inductors that may be used to block higher-frequency alternating current (AC) in an electrical circuit while passing lower-frequency or DC, which reduces losses and improves efficiency.

Figure 4D:
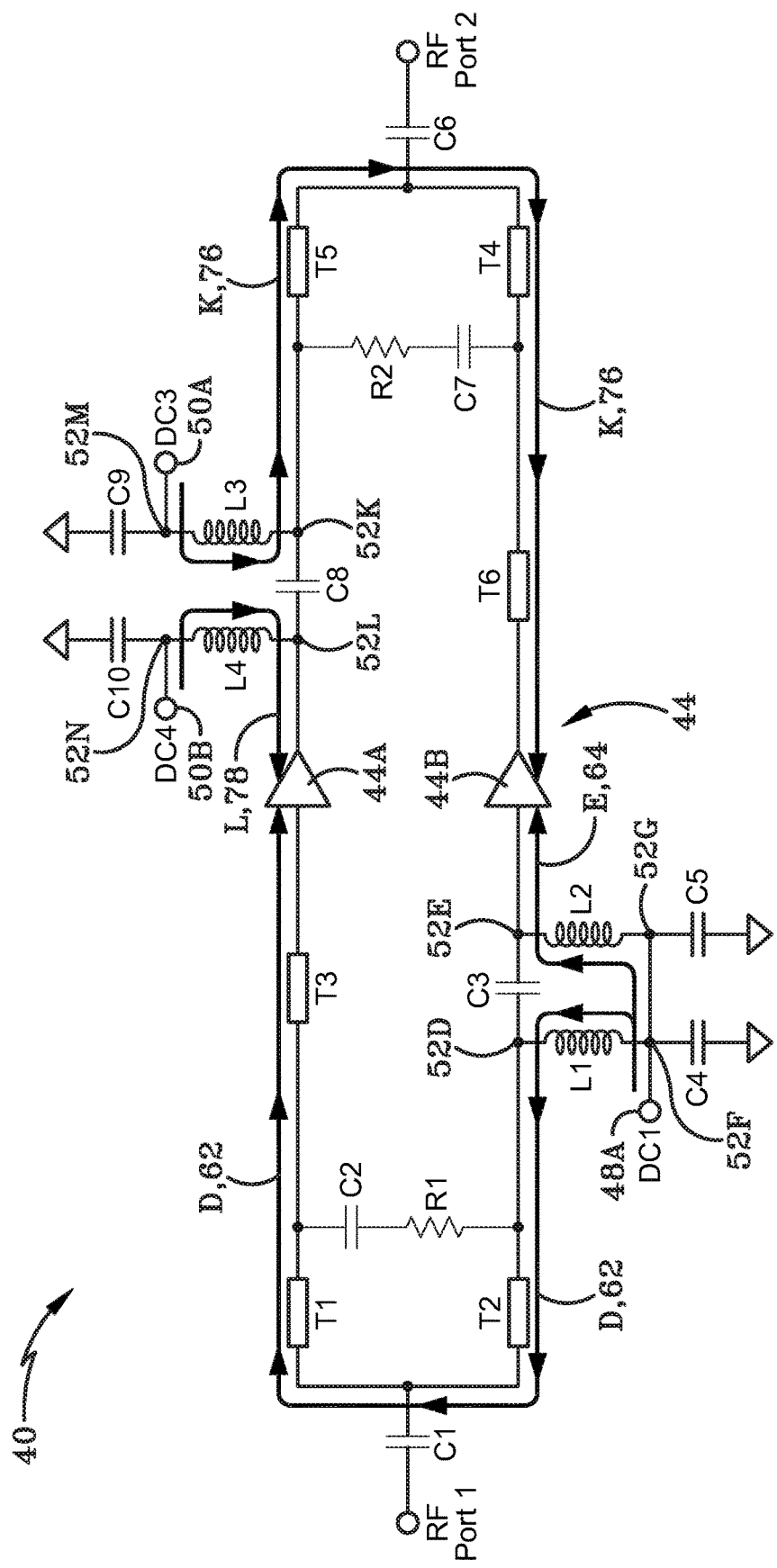
FIG. 4D is a schematic circuit diagram of the RF power amplifier in accordance with one embodiment of the present disclosure.

FIG. 4D is a schematic circuit diagram of the RF power amplifier 40 in accordance with one embodiment of the present disclosure where the first phase difference network 48 includes different circuitry than the circuitry described above and shown in FIG. 4C. In accordance with this embodiment, the second input DC bias injection port 48B is removed. Therefore, in this embodiment, the first phase difference network 48 may include the first input DC bias injection port 48A, the second capacitor 48C, the third capacitor 48D, the fourth capacitor 48E, the fifth capacitor 48F, the third nominally quarter wavelength transmission line 48G, the first inductor 48H and the second inductor 48I. The first input DC bias injection port 48A may provide the first bias signal 62 to the first amplifier 44A in the same manner as described above and shown in FIG. 4C. In this embodiment, the first input DC bias injection port 48A may provide the second bias signal 64 to the second amplifier 44B. In this embodiment, the second bias signal 64 travels across the sixth node 52F and the seventh node 52G and then follows a similar path of travel as described above and shown in FIG. 4C.

Figure 4E:
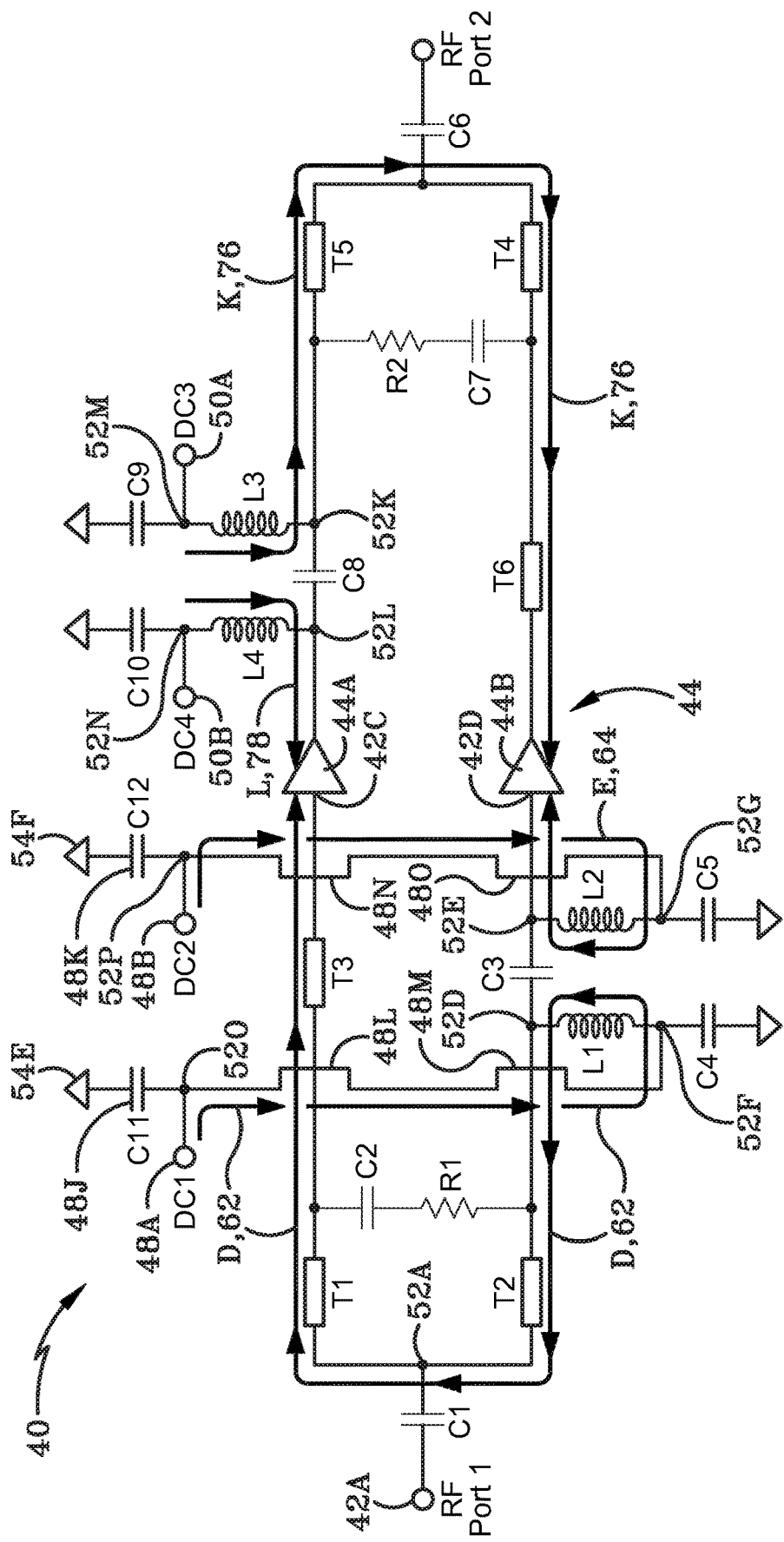
FIG. 4E is a schematic circuit diagram of the RF power amplifier in accordance with one embodiment of the present disclosure.

FIG. 4E is a schematic circuit diagram of the RF power amplifier 40 in accordance with one embodiment of the present disclosure where the first phase difference network 48 includes different circuitry than the circuitry described above and shown in FIG. 4C. In accordance with this embodiment, the first input DC bias injection port 48A and the second input DC bias injection port 48B of the first phase difference network 48 are positioned on the opposite side of the RF power amplifier 40 than the first input DC bias injection port 48A and the second input DC bias injection port 48B of FIG. 4C. Therefore, in this embodiment, the first phase difference network 48 may include the first input DC bias injection port 48A, the second input DC bias injection port 48B, the second capacitor 48C, the third capacitor 48D, the fourth capacitor 48E, the fifth capacitor 48F, the third nominally quarter wavelength transmission line 48G, the first inductor 48H, the second inductor 48I, an eleventh capacitor 48J, a twelfth capacitor 48K, a first RF path crossing 48L, a second RF path crossing 48M, a third RF path crossing 48N and a fourth RF path crossing 48O. In this embodiment, the RF power amplifier 40 may further include a fifteenth node 52O, a sixteenth node 52P, a fifth ground 54E and a sixth ground 54F.

In this embodiment, the first input DC bias injection port 48A may be connected to the fifteenth node 52O. The eleventh capacitor 48J may be connected between the fifteenth node 52O and the fifth ground 54E. In this embodiment, the second input DC bias injection port 48B may be connected to the sixteenth node 52P. The twelfth capacitor 48K may be connected between the sixteenth node 52P and the sixth ground 54F. The first RF path crossing 48L may be positioned between the first node 52A and the first output port 42C. The second RF path crossing 48M may be positioned between the first node 52A and the second output port 42D. The third RF path crossing 48N may be positioned between the first node 52A and the first output port 42C. The fourth RF path crossing 48O may be positioned between the first node 52A and the second output port 42D.

In this embodiment, the first input DC bias injection port 48A may provide the first bias signal 62 to the first amplifier 44A. The first bias signal 62 travels along a signal path represented by arrow D (FIG. 4E). The first bias signal 62 travels across the fifteenth node 52O, across the first RF path crossing 48L, across the second RF path crossing 48M, across the sixth node 52F and then travels to the first amplifier 44A in the same manner as described above and shown in FIG. 4C.

In this embodiment, the second input DC bias injection port 48B may provide the second bias signal 64. The second bias signal 64 travels along a signal path represented by arrow E (FIG. 4E). The second bias signal 64 travels across the sixteenth node 52P, across the third RF path crossing 48N, the fourth RF path crossing 48O, across the seventh node 52G and then travels to the second amplifier 44B in the same manner as described above and shown in FIG. 4C.

Figure 4F:
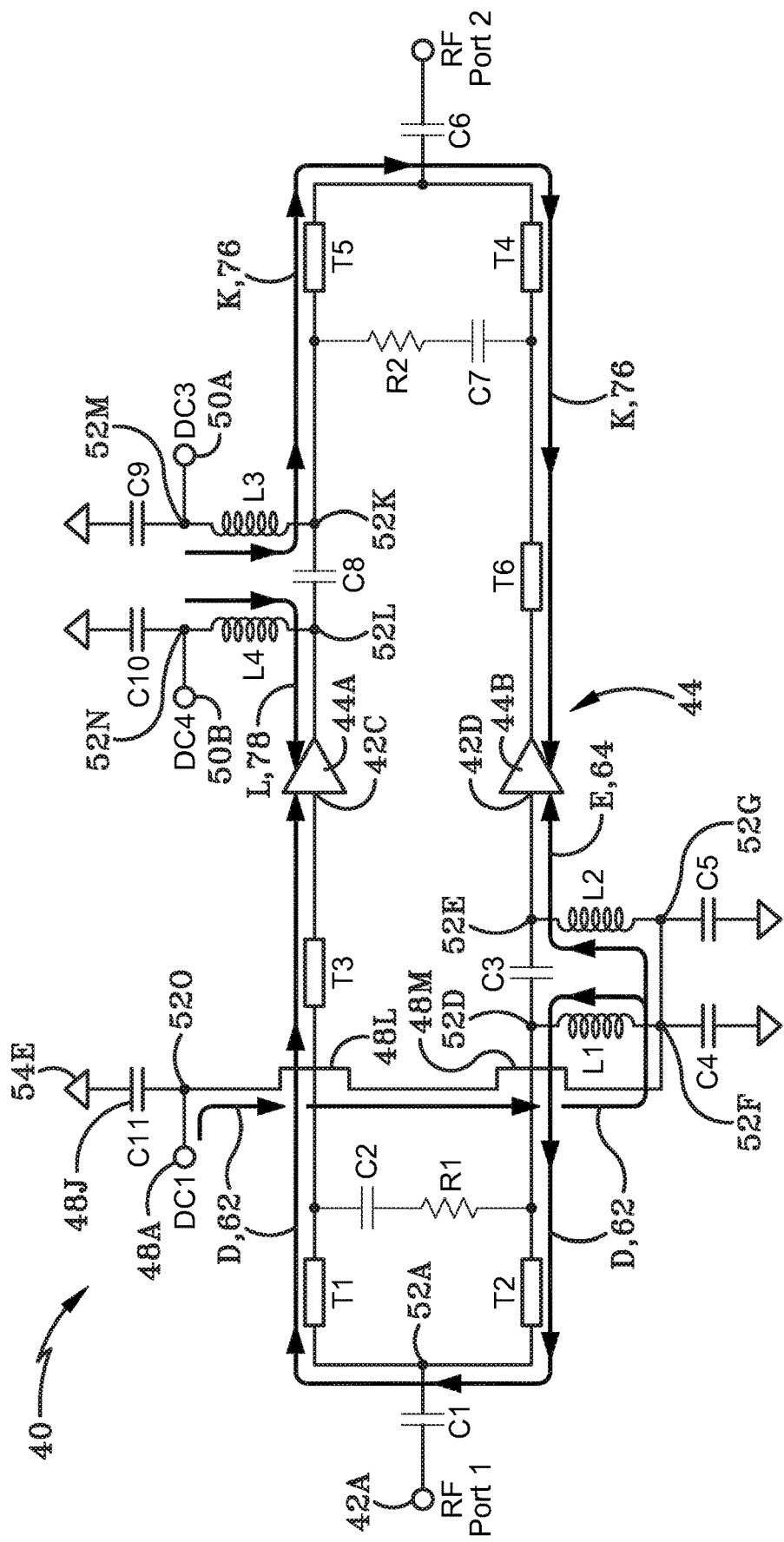
FIG. 4F is a schematic circuit diagram of the RF power amplifier in accordance with one embodiment of the present disclosure.

FIG. 4F is a schematic circuit diagram of the RF power amplifier 40 in accordance with one embodiment of the present disclosure where the first phase difference network 48 includes different circuitry than the circuitry described above and shown in FIG. 4C. The circuitry of this embodiment is similar to the circuitry described above and shown in FIG. 4E; however, the second input DC bias injection port 48B, the twelfth capacitor 48K, the sixteenth node 52P, the third RF path crossing 48N and the fourth RF path crossing 48O are removed in this embodiment. Therefore, in this embodiment, the first phase difference network 48 may include the first input DC bias injection port 48A, the second capacitor 48C, the third capacitor 48D, the fourth capacitor 48E, the fifth capacitor 48F, the third nominally quarter wavelength transmission line 48G, the first inductor 48H, the second inductor 48I, the eleventh capacitor 48J, the first RF path crossing 48L and the second RF path crossing 48M. In this embodiment, the RF power amplifier 40 may further include the fifteenth node 52O and the fifth ground 54E.

In this embodiment, the first input DC bias injection port 48A may be connected to the fifteenth node 52O. The eleventh capacitor 48J may be connected between the fifteenth node 52O and the fifth ground 54E. The first RF path crossing 48L may be positioned between the first node 52A and the first output port 42C. The second RF path crossing 48M may be positioned between the first node 52A and the second output port 42D.

In this embodiment, the first input DC bias injection port 48A may provide the first bias signal 62 to the first amplifier 44A and the second bias signal 64 to the second amplifier 44B. The first bias signal 62 travels along a signal path represented by arrow D (FIG. 4F). The first bias signal 62 travels across the fifteenth node 52O, across the first RF path crossing 48L, across the second RF path crossing 48M, and across the sixth node 52F and then travels to the first amplifier 44A in the same manner as described above and shown in FIG. 4C. The second bias signal 64 travels along a signal path represented by arrow E (FIG. 4F). The second bias signal 64 travels across the fifteenth node 52O, across the first RF path crossing 48L, across the second RF path crossing 48M, across the sixth node 52F and across the seventh node 52G and then travels to the second amplifier 44B in the same manner as described above and shown in FIG. 4C.

Figure 4G:
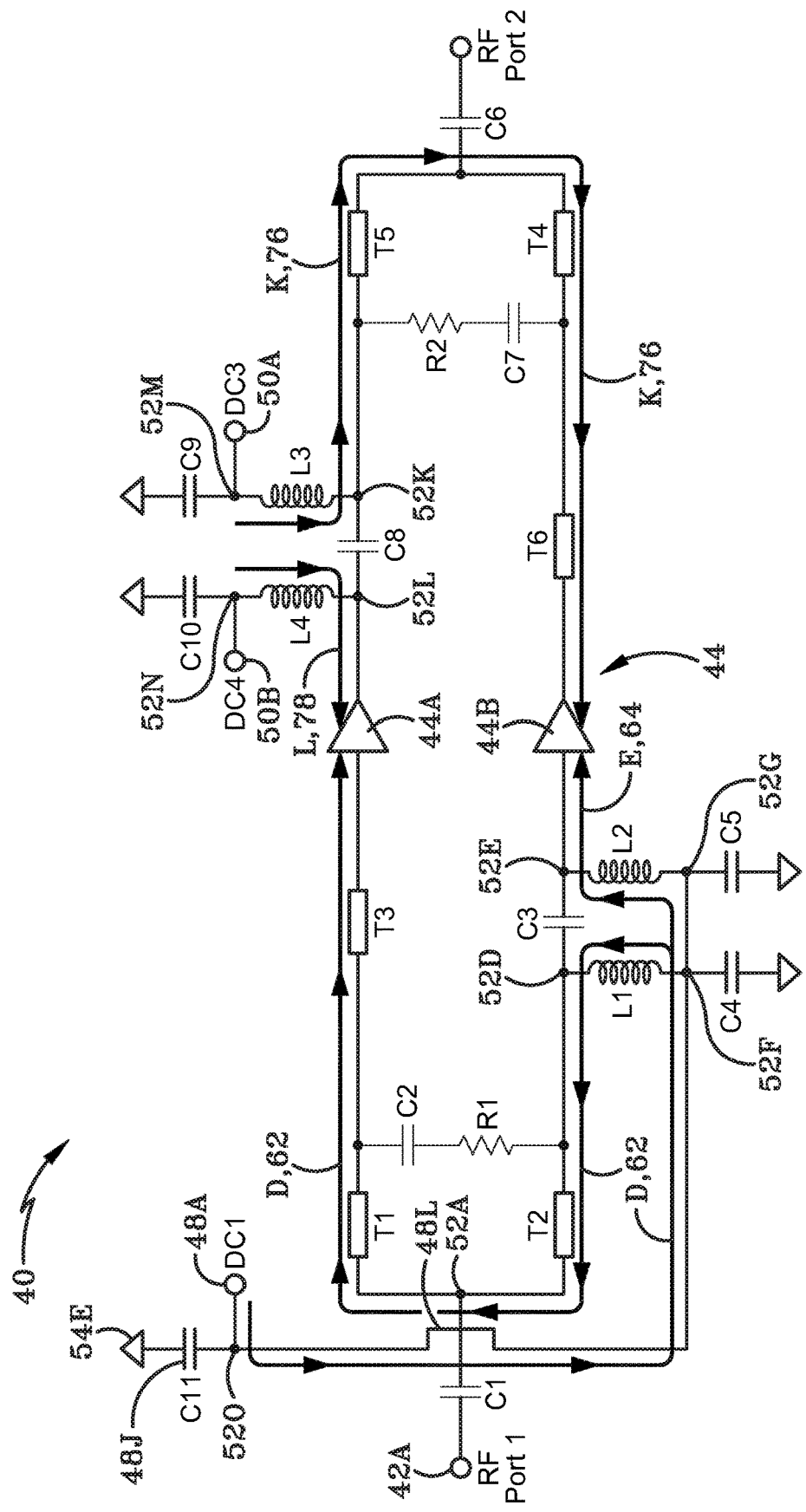
FIG. 4G is a schematic circuit diagram of the RF power amplifier in accordance with one embodiment of the present disclosure.

FIG. 4G is a schematic circuit diagram of the RF power amplifier 40 in accordance with one embodiment of the present disclosure where the first phase difference network 48 includes different circuitry than the circuitry described above and shown in FIG. 4C. The circuitry of this embodiment is similar to the circuitry described above and shown in FIG. 4F; however, the second RF path crossing 48M, the second input DC bias injection port 48B, the twelfth capacitor 48K, the sixteenth node 52P, the third RF path crossing 48N and the fourth RF path crossing 48O are removed in this embodiment. Therefore, in this embodiment, the first phase difference network 48 may include the first input DC bias injection port 48A, the second capacitor 48C, the third capacitor 48D, the fourth capacitor 48E, the fifth capacitor 48F, the third nominally quarter wavelength transmission line 48G, the first inductor 48H, the second inductor 48I, the eleventh capacitor 48J and the first RF path crossing 48L. In this embodiment, the RF power amplifier 40 may further include the fifteenth node 52O and the fifth ground 54E.

In this embodiment, the first input DC bias injection port 48A may be connected to the fifteenth node 52O. The eleventh capacitor 48J may be connected between the fifteenth node 52O and the fifth ground 54E. The first RF path crossing 48L may be positioned between the RF input port 42A and the first node 52A.

In this embodiment, the first input DC bias injection port 48A may provide the first bias signal 62 to the first amplifier 44A and the second bias signal 64 to the second amplifier 44B. The first bias signal 62 travels along a signal path represented by arrow D (FIG. 4G). The first bias signal 62 travels across the fifteenth node 52O, across the first RF path crossing 48L and across the sixth node 52F and then travels to the first amplifier 44A in the same manner as described above and shown in FIG. 4C. The second bias signal 64 travels along a signal path represented by arrow E (FIG. 4G). The second bias signal 64 travels across the fifteenth node 52O, across the first RF path crossing 48L, across the sixth node 52F and across the seventh node 52G and then travels to the second amplifier 44B in the same manner as described above and shown in FIG. 4C.

Figure 5:
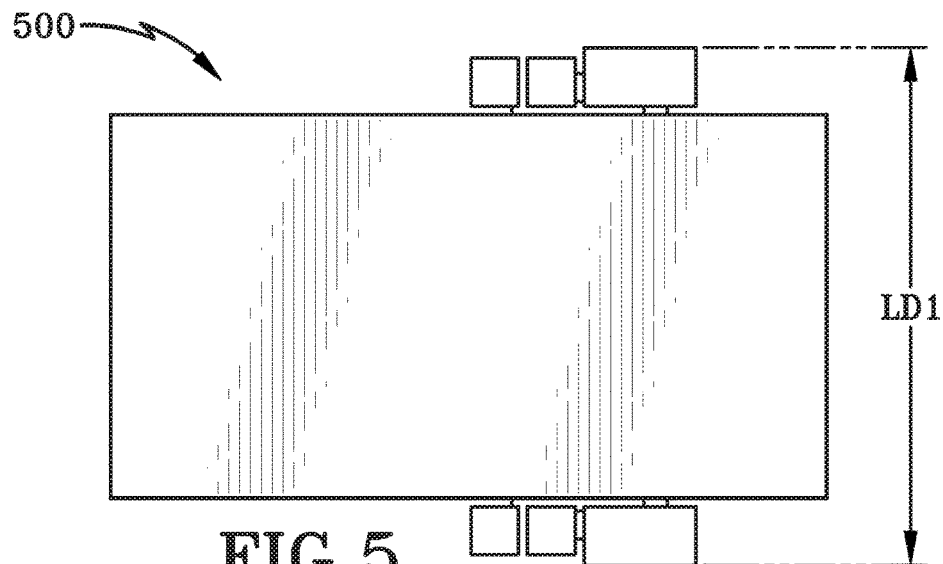
FIG. 5 is a diagram showing a general topology of a PRIOR ART MMIC power combined amplifier which utilizes Lange couplers with required off-chip circuitry.

FIG. 5 is a diagram showing a general topology of a PRIOR ART MMIC power combined amplifier 500 which utilizes Lange couplers with required off-chip circuitry. The PRIOR ART MMIC power combined amplifier of FIG. 5 includes a lateral dimension LD1. PRIOR ART MMIC power combined amplifier 500 is an example of an RF power amplifier comprising bias circuitry on two opposing sides of the power combined amplifier 500.

Figure 6:
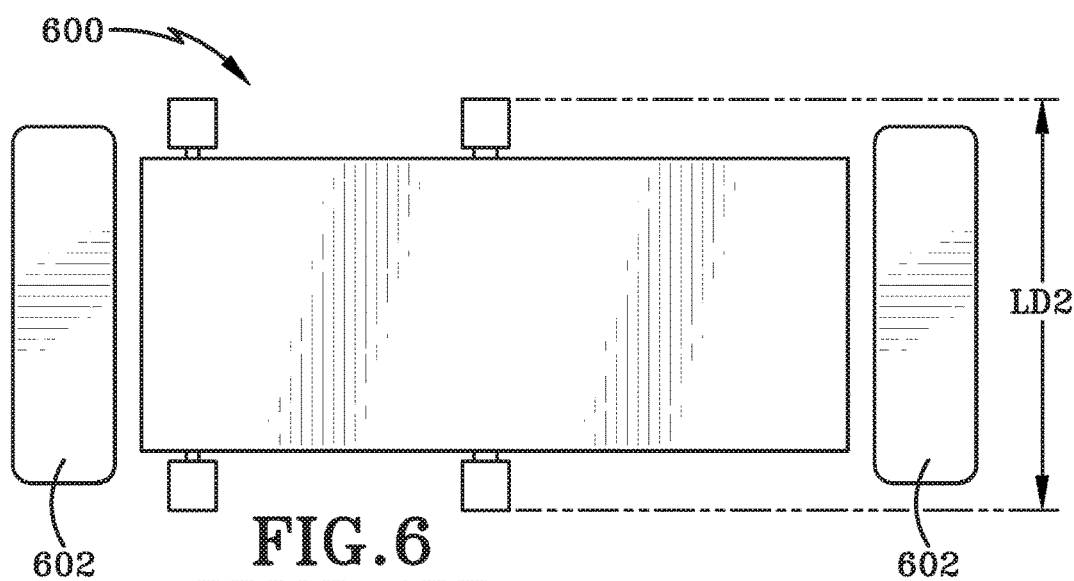
FIG. 6 is a diagram showing a general topology of a PRIOR ART MMIC power combined amplifier.

FIG. 6 is a diagram showing a general topology of a PRIOR ART MMIC power combined amplifier 600 which utilizes off-chip couplers 602 with required off-chip circuitry (not shown). The PRIOR ART MMIC power combined amplifier of FIG. 6 includes a lateral dimension LD2. PRIOR ART MMIC power combined amplifier 600 is an example of an RF power amplifier comprising bias circuitry on two opposing sides of the power combined amplifier 600.

Figure 7:
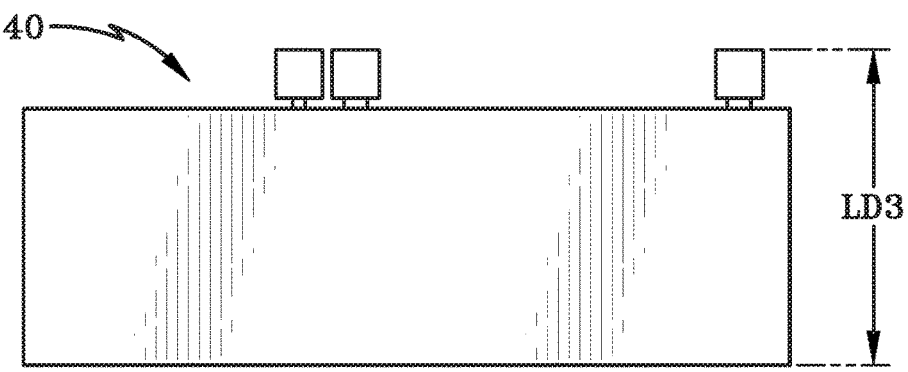
FIG. 7 is a diagram showing a general topology of the RF power amplifier in accordance with one aspect of the present disclosure.

FIG. 7 is a diagram showing a general topology of the RF power amplifier 40 in accordance with one aspect of the present disclosure. The RF power amplifier 40 includes a lateral dimension LD3. In one example, the RF power amplifier 40 comprises bias circuitry on the same side of the RF power amplifier 40. Thus, the RF power amplifier 40 includes a lateral dimension narrower than a lateral dimension of an RF power amplifier comprising bias circuitry on two opposing sides of the RF power amplifier.

As shown in FIG. 5, FIG. 6 and FIG. 7, the lateral dimension LD3 of the RF power combiner is less than the lateral dimension LD2 of the PRIOR ART MMIC power combined amplifier 600 and less than the lateral dimension LD1 of the PRIOR ART MMIC power combined amplifier 500. In one example, LD3 is equal to 5016 micrometers, LD2 is equal to 6529 micrometers and LD1 is equal to 8239 micrometers. The reduced lateral dimension LD3 of the RF power combiner 40 is accomplished, at least in part, by utilizing the first phase difference network 48 and the second phase difference network 50 to provide both DC bias injection and low loss RF signal combining.

Figure 8A:
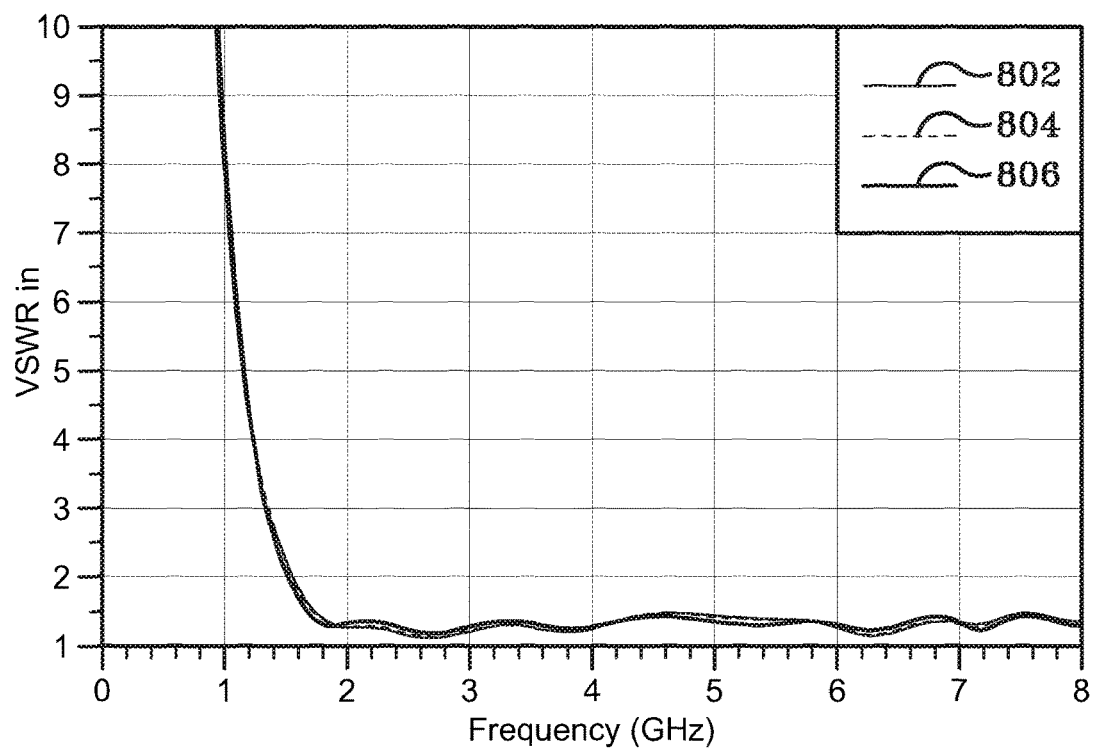
FIG. 8A is a graph of simulated input Voltage Standing Wave Ratio (VSWR) performance of the RF power amplifier over frequency in accordance with one aspect of the present disclosure.
Figure 8B:
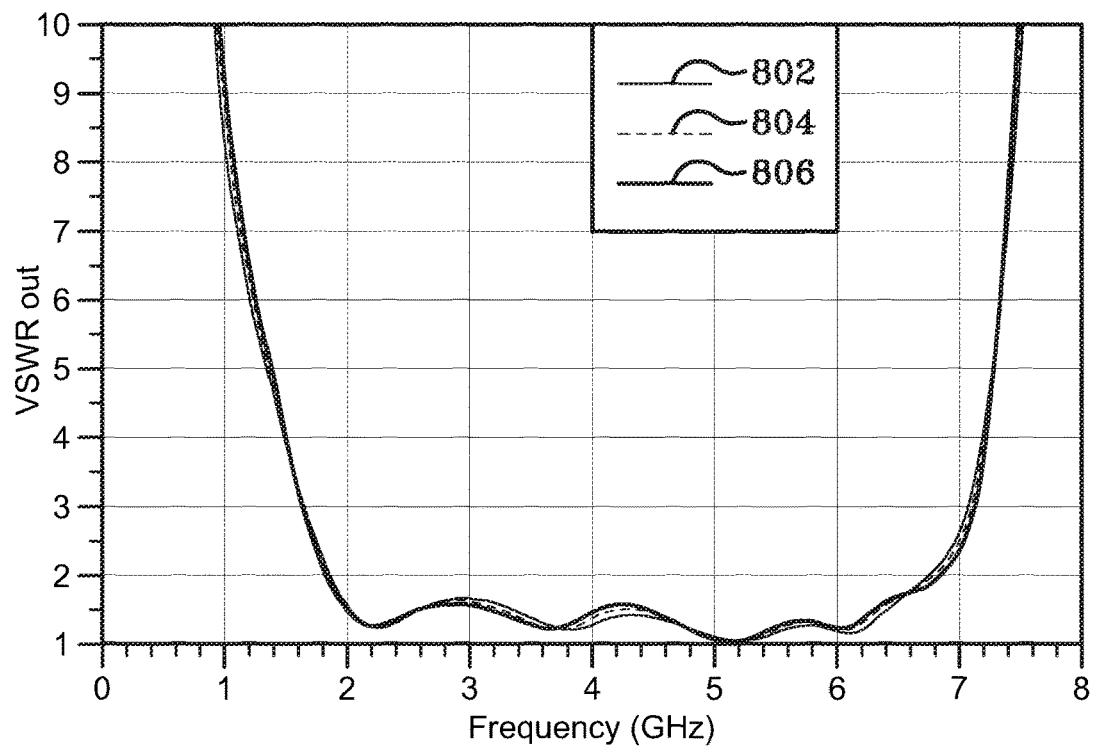
FIG. 8B is a graph of simulated output VSWR performance of the RF power amplifier over frequency in accordance with one aspect of the present disclosure.

FIG. 8A and FIG. 8B are graphs of simulated input and output Voltage Standing Wave Ratio (VSWR) performance of the RF power amplifier 40 over frequency at −54 degrees Celsius, which is represented by line 802, at +25 degrees Celsius, which is represented by line 804, and at +95 degrees Celsius, which is represented by line 806. In this example, the drain supply voltage Vd is equal to 30 Volts (V). The low VSWRs over a design bandwidth of two to six Gigahertz (GHz) are the result of reflected signals being rendered out of phase and dissipated in the first and second resistor 42G and 46G of the RF power amplifier 40.

Figure 9A:
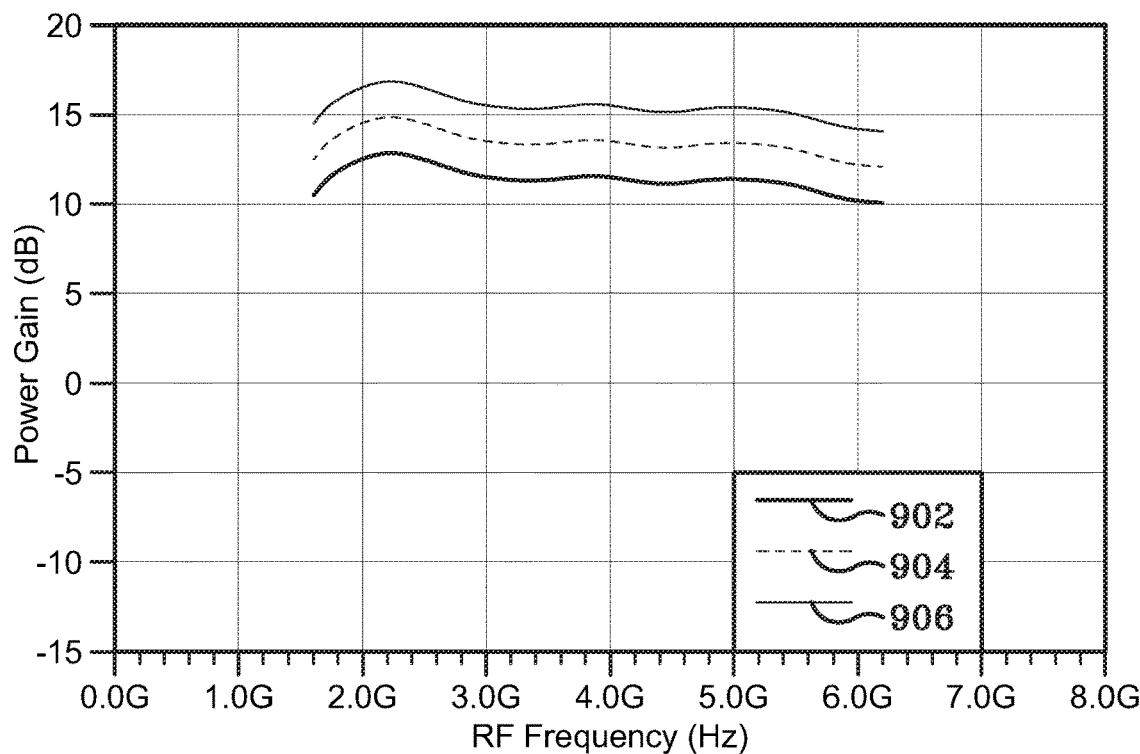
FIG. 9A is a graph of power gain in decibels (dB) over frequency different gain compressions.
Figure 9B:
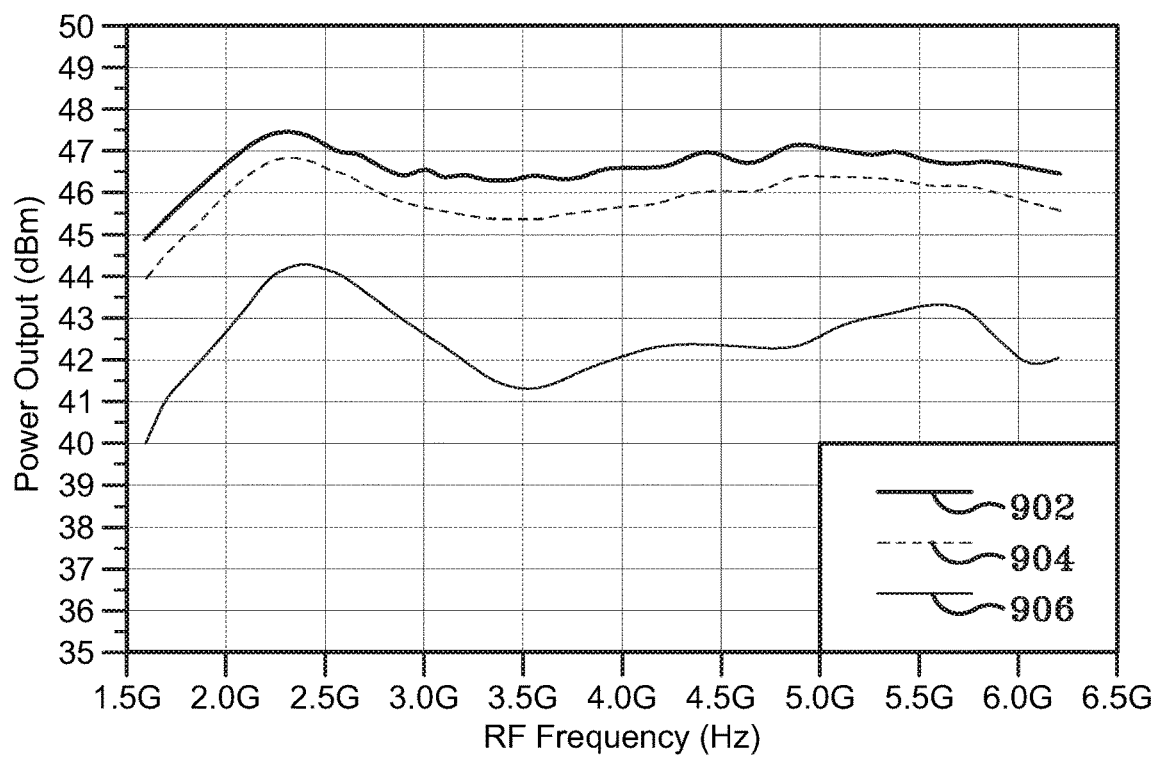
FIG. 9B is a graph of power output in decibel-milliwatts (dBm) over frequency at different gain compressions.
Figure 9C:
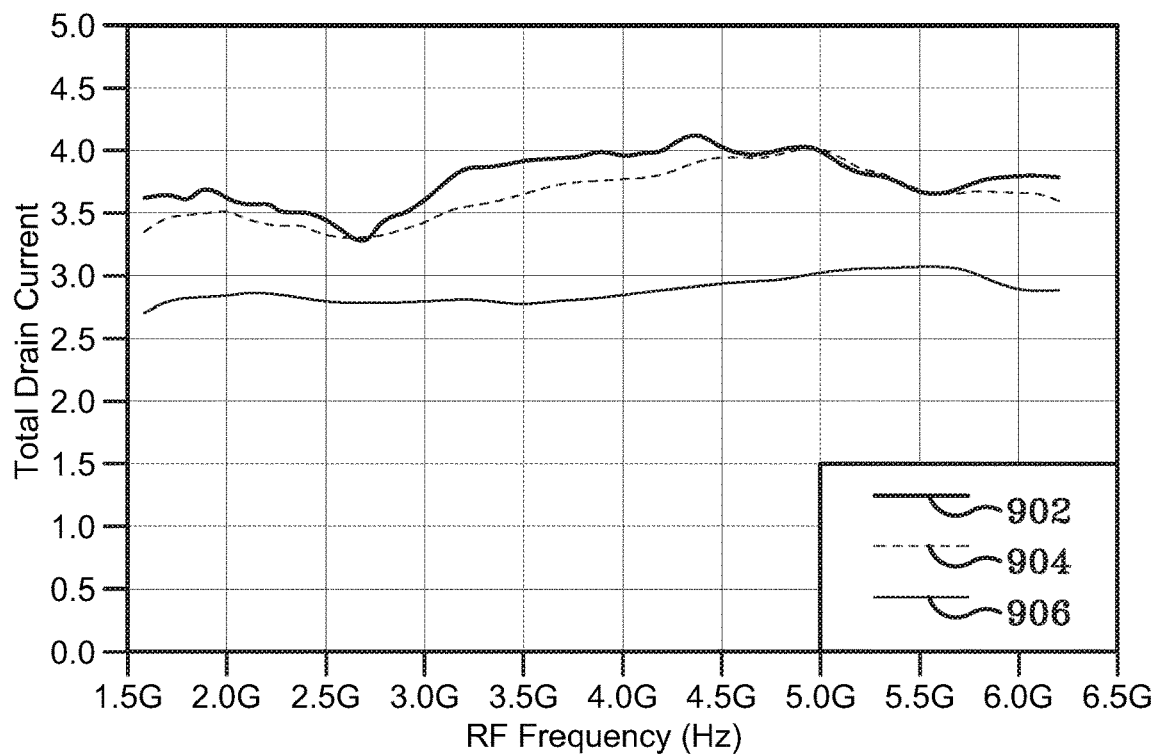
FIG. 9C is a graph of total drain current over frequency at different gain compressions.
Figure 9D:
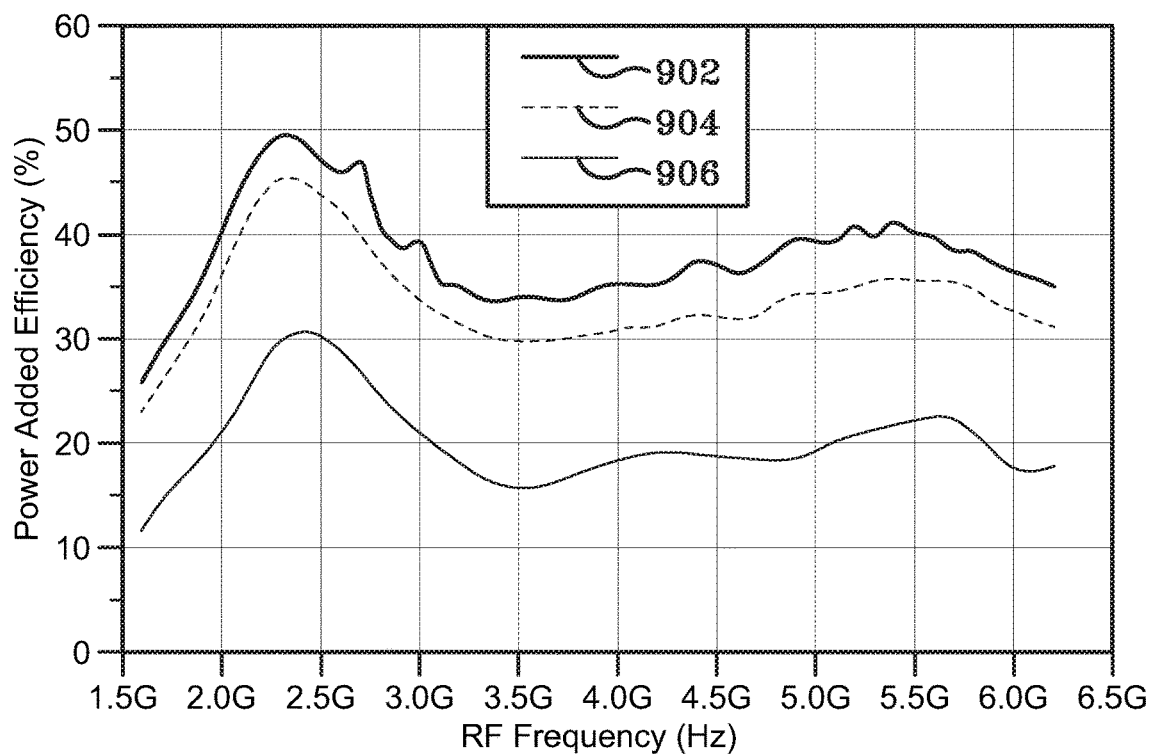
FIG. 9D is a graph of power added efficiency percentage over frequency at different gain compressions.

FIG. 9A, FIG. 9B, FIG. 9C, and FIG. 9D are graphs of simulated performance of the RF power amplifier 40. The temperature for this situation is equal to +25 degrees Celsius and the drain supply voltage Vd is equal to 30 V. More specifically, FIG. 9A is a graph of power gain in decibels (dB) over frequency at 5 dB gain compression, which is represented by line 902, at 3 dB gain compression, which is represented by line 904, and at 1 dB gain compression, which is represented by line 906. FIG. 9B is a graph of power output in decibel-milliwatts (dBm) over frequency at 5 dB gain compression, which is represented by line 902, at 3 dB gain compression, which is represented by line 904, and at 1 dB gain compression, which is represented by line 906. FIG. 9C is a graph of total drain current over frequency at 5 dB gain compression, which is represented by line 902, at 3 dB gain compression, which is represented by line 904, and at 1 dB gain compression, which is represented by line 906. FIG. 9D is a graph of power added efficiency percentage over frequency at 5 dB gain compression, which is represented by line 902, at 3 dB gain compression, which is represented by line 904, and at 1 dB gain compression, which is represented by line 906. The maximum simulated power added efficiency for the RF power amplifier 40 is equal to approximately 35%-50% which is greater than a simulated performance of the PRIOR ART MMIC power amplifier 500 which has a power added efficiency of approximately 26%-36% over the design bandwidth of 2 to 6 GHz.

Figure 10:
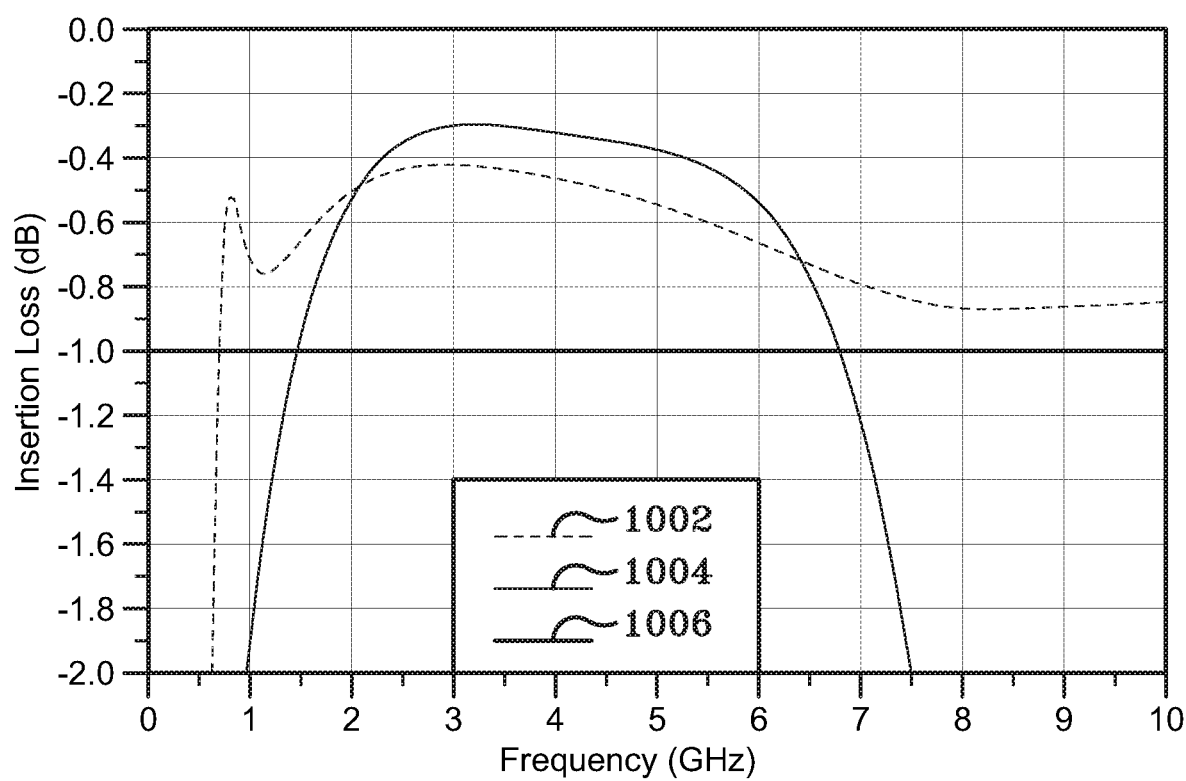
FIG. 10 is a graph of insertion loss in dB over frequency of the RF power amplifier of the present disclosure and a conventional back to back Lange coupler.

FIG. 10 is a graph of insertion loss in dB over frequency of the RF power amplifier 40 and a conventional back to back Lange coupler. Line 1002 represents the RF power amplifier, line 1004 represents the back to back Lange coupler, and line 1006 represents a 1 dB insertion loss threshold. As shown in FIG. 10, using a 1.0 dB insertion loss threshold, the RF power amplifier 40 of the present disclosure may efficiently power combine over a bandwidth greater than 10:1 compared to a maximum Lange bandwidth of less than 4:1.

It is envisioned that the teachings of the present disclosure may be extended to power combine more than two power amplifiers.

It is envisioned that the RF power amplifier 40 may be utilized for, inter alia, countermeasure devices (not shown).

One way of increasing the power of power amplifiers is by increasing the size of the transistors. However, one drawback of associated with increasing the size of the transistors, is that it becomes difficult to impedance match. When it becomes impedance match the efficiency is also decreased. There is always a limit in the amount of energy available to use for amplifying. Also, if the system is inefficient, then the system becomes hot, which poses another problem.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The indefinite articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

The above-described embodiments can be implemented in any of numerous ways. For example, embodiments of technology disclosed herein may be implemented using hardware, software, or a combination thereof. When implemented in software, the software code or instructions can be executed on any suitable processor or collection of processors, whether provided in a single computer or distributed among multiple computers. Furthermore, the instructions or software code can be stored in at least one non-transitory computer readable storage medium.

Also, a computer or smartphone utilized to execute the software code or instructions via its processors may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers or smartphones may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software/instructions that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, Universal Serial Bus (USB) flash drives, SD cards, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the disclosure discussed above. The computer readable medium or media can be transportable, such that the program or programs stored thereon can be loaded onto one or more different computers or other processors to implement various aspects of the present disclosure as discussed above.

The terms "program" or "software" or "instructions" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present disclosure need not reside on a single computer or processor, but may be distributed in a modular fashion amongst a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

All definitions, as defined and used herein, should be understood to control over dictionary definitions, definitions in documents incorporated by reference, and/or ordinary meanings of the defined terms.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like a processor (e.g., microprocessor), an application specific integrated circuit (ASIC), a programmed logic device, a memory device containing instructions, an electric device having a memory, or the like. Logic may include one or more gates, combinations of gates, or other circuit components. Logic may also be fully embodied as software. Where multiple logics are described, it may be possible to incorporate the multiple logics into one physical logic. Similarly, where a single logic is described, it may be possible to distribute that single logic between multiple physical logics.

Furthermore, the logic(s) presented herein for accomplishing various methods of this system may be directed towards improvements in existing computer-centric or internet-centric technology that may not have previous analog versions. The logic(s) may provide specific functionality directly related to structure that addresses and resolves some problems identified herein. The logic(s) may also provide significantly more advantages to solve these problems by providing an exemplary inventive concept as specific logic structure and concordant functionality of the method and system. Furthermore, the logic(s) may also provide specific computer implemented rules that improve on existing technological processes. The logic(s) provided herein extends beyond merely gathering data, analyzing the information, and displaying the results.

Additionally, the method of performing the present disclosure may occur in a sequence different than those described herein. Accordingly, no sequence of the method should be read as a limitation unless explicitly stated. It is recognizable that performing some of the steps of the method in an different order could achieve a similar result.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of the preferred embodiment of the disclosure are an example and the disclosure is not limited to the exact details shown or described.

The invention claimed is:

1. An RF power amplifier comprising:
an input coupler comprising a first resistor and a first capacitor;
an input phase difference network of the input coupler comprising a first input direct current (DC) bias injection network and a second capacitor connected in series with the first resistor; wherein the second capacitor increases a bandwidth of the RF power amplifier;
a first power amplifier;
a second power amplifier; wherein the first input DC bias injection network provides power to the first power amplifier and the second power amplifier;
an output coupler comprising a second resistor and a third capacitor; and
an output phase difference network of the output coupler comprising a first output DC bias injection network, a second output DC bias injection network and a fourth capacitor connected in series with the second resistor; wherein the first input DC bias injection network is on a first side of the RF power amplifier and the first output DC bias injection network and the second output DC bias injection network are on the first side of the RF power amplifier.

2. The RF power amplifier of claim 1, further comprising:
a bandwidth ratio of at least approximately 4:1.

3. The RF power amplifier of claim 1, further comprising:
a lateral dimension narrower than a lateral dimension of an RF power amplifier comprising bias circuitry on two opposing sides.

4. The RF power amplifier of claim 1, further comprising:
at least one RF path crossing of the first input DC bias injection network.

5. The RF power amplifier of claim 4, further comprising:
a first node of the input coupler;
an RF input port of the input coupler;
an input of the first amplifier; and
an input of the second amplifier; wherein the first node is connected between the RF input port of the input coupler, the input of the first amplifier and the input of the second amplifier; and wherein the at least one RF path crossing is positioned between the RF input port of the input coupler and the first node.

6. The RF power amplifier of claim 4, further comprising:
a first node of the input coupler;
an RF input port of the input coupler;
an input of the first amplifier; and
an input of the second amplifier; wherein the first node is connected between the RF input port of the input coupler, the input of the first amplifier and the input of the second amplifier; and wherein one of the at least one RF path crossing is positioned between the first node and the input of the first amplifier and one of the at least one RF path crossing is positioned between the first node and the input of the second amplifier.

7. The RF power amplifier of claim 1, further comprising:
a second input DC bias injection network;
at least one RF path crossing of the first input DC bias injection network; and
at least one RF path crossing of the second input DC bias injection network; and wherein the first input DC bias injection network provides power to the first amplifier and the second input DC bias injection network provides power to the second amplifier.

8. The RF power amplifier of claim 7, further comprising:
a first node of the input coupler;
an RF input port of the input coupler;
an input of the first amplifier; and
an input of the second amplifier; wherein the first node is connected between the RF input port of the input coupler, the input of the first amplifier and the input of the second amplifier; and wherein one of the at least one RF path crossing of the first input DC bias injection network is positioned between the first node and the input of the first amplifier; and wherein one of the at least one RF path crossing of the first input DC bias injection network is positioned between the first node and the input of the second amplifier; and wherein one of the at least one RF path crossing of the second input DC bias injection network is positioned between the first node and the input of the first amplifier; and wherein one of the at least one RF path crossing of the second input DC bias injection network is positioned between the first node and the input of the second amplifier.

9. The RF power amplifier of claim 1, further comprising:
a first node;
a second node;
a third node;
a fourth node;
a fifth node;
a sixth node;
a seventh node;
a first ground;
a second ground;
an RF input port of the input coupler, the first capacitor connected between the RF input port of the input coupler and the first node;
a first transmission line connected between the first node and the second node;
a second transmission line connected between the first node and the third node;
the second capacitor connected between the second node and the first resistor;
the first resistor connected between the second capacitor and the third node;
a third transmission line connected between the second node and the first amplifier;
a third capacitor connected between the fourth node and the fifth node;
a first inductor connected between the fourth node and the sixth node;
a first DC bias injection port of the first input DC bias injection network connected to the sixth node;
the sixth node connected to the seventh node;
a fourth capacitor connected between the sixth node and the first ground;
a second inductor connected between the fifth node and the seventh node;
a fifth capacitor connected between the seventh node and the second ground;
the first amplifier connected to the third transmission line; and
the second amplifier connected to the fifth node.

10. The RF power amplifier of claim 9, further comprising:
an eighth node;
a ninth node;
a tenth node;
an eleventh node;
a twelfth node;
a thirteenth node;
a fourteenth node;
a third ground;
a fourth ground;
an output coupler including an RF output port, a second resistor and a sixth capacitor; the sixth capacitor connected between the RF output port of the output coupler and the eighth node;
an output phase difference network of the output coupler including a first output DC bias injection network, a second output DC bias injection network and a seventh capacitor; the seventh capacitor connected in series with the second resistor between the tenth node and the second resistor;
a fourth transmission line connected between the eighth node and the tenth node;
a fifth transmission line connected between the eighth node and the ninth node;
the second resistor connected between the seventh capacitor and the ninth node;
a sixth transmission line connected between the tenth node and the second amplifier;
an eighth capacitor connected between the eleventh node and the twelfth node;
a third inductor connected between the eleventh node and the thirteenth node;
a third DC bias injection port of the first output DC bias injection network connected to the thirteenth node;
a fourth DC bias injection port of the second output DC bias injection network connected to the fourteenth node;
a ninth capacitor connected between the thirteenth node and the third ground;
a fourth inductor connected between the twelfth node and the fourteenth node;
a tenth capacitor connected between the fourteenth node and the fourth ground;
the first amplifier connected to the twelfth node; and
the second amplifier connected to the sixth transmission line.

11. The RF power amplifier of claim 1, further comprising:
a first node;
a second node;
a third node;
a fourth node;
a fifth node;
a sixth node;
a seventh node;
an eighth node;
a first ground;
a second ground;
a third ground;
an RF input port of the input coupler, the first capacitor connected between the RF input port of the input coupler and the first node;
a first transmission line connected between the first node and the second node;
a second transmission line connected between the first node and the third node;
the second capacitor connected between the second node and the first resistor;
the first resistor connected between the second capacitor and the third node;
a first output port of the input coupler;
a third transmission line connected between the second node and the first output port of the input coupler;
a third capacitor connected between the fourth node and the fifth node;
a first inductor connected between the fourth node and the sixth node;
a first DC bias injection port of the first input DC bias injection network connected to the eighth node;
the sixth node connected to the seventh node;
a fourth capacitor connected between the sixth node and the first ground;
a first RF path crossing between the first capacitor and the first node;
a second inductor connected between the fifth node and the seventh node;
a fifth capacitor connected between the seventh node and the second ground;
a sixth capacitor connected between the eighth node and the third ground;

the first amplifier connected to the third transmission line; and the second amplifier connected to the fifth node.

12. The RF power amplifier of claim 11, further comprising:
   a ninth node;
   a tenth node;
   an eleventh node;
   a twelfth node;
   a thirteenth node;
   a fourteenth node;
   a fourth ground;
   a fifth ground;
   an output coupler including an RF output port, a second resistor and a sixth capacitor; the sixth capacitor connected between the RF output port of the output coupler and the eighth node;
   an output phase difference network of the output coupler including a first output DC bias injection network, a second output DC bias injection network and a seventh capacitor; the seventh capacitor connected in series with the second resistor between the tenth node and the second resistor;
   a fourth transmission line connected between the eighth node and the tenth node;
   a fifth transmission line connected between the eighth node and the ninth node;
   the second resistor connected between the seventh capacitor and the ninth node;
   a sixth transmission line connected between the tenth node and the second amplifier;
   an eighth capacitor connected between the eleventh node and the twelfth node;
   a third inductor connected between the eleventh node and the thirteenth node;
   a third DC bias injection port of the second output DC bias injection network connected to the thirteenth node;
   a fourth DC bias injection port of the second output DC bias injection network connected to the fourteenth node;
   a ninth capacitor connected between the thirteenth node and the fourth ground;
   a fourth inductor connected between the twelfth node and the fourteenth node;
   a tenth capacitor connected between the fourteenth node and the fifth ground;
   the first amplifier connected to the twelfth node; and
   the second amplifier connected to the sixth transmission line.

13. The RF power amplifier of claim 1, further comprising:
   a first node;
   a second node;
   a third node;
   a fourth node;
   a fifth node;
   a sixth node;
   a seventh node;
   an eighth node;
   a first ground;
   a second ground;
   a third ground;
   an RF input port of the input coupler, the first capacitor connected between the RF input port of the input coupler and the first node;
   a first transmission line connected between the first node and the second node;
   a second transmission line connected between the first node and the third node;
   the second capacitor connected between the second node and the first resistor;
   the first resistor connected between the second capacitor and the third node;
   a first output port of the input coupler;
   a third transmission line connected between the second node and the first output port of the input coupler;
   a third capacitor connected between the fourth node and the fifth node;
   a first inductor connected between the fourth node and the sixth node;
   a first DC bias injection port of the first input DC bias injection network connected to the eighth node;
   the sixth node connected to the seventh node;
   a fourth capacitor connected between the sixth node and the first ground;
   a first RF path crossing between the second node and the third transmission line;
   a second RF path crossing between the third node and the fourth node;
   a second inductor connected between the fifth node and the seventh node;
   a fifth capacitor connected between the seventh node and the second ground;
   a sixth capacitor connected between the eighth node and the third ground;
   the first amplifier connected to the third transmission line; and
   the second amplifier connected to the fifth node.

14. The RF power amplifier of claim 13, further comprising:
   a ninth node;
   a tenth node;
   an eleventh node;
   a twelfth node;
   a thirteenth node;
   a fourteenth node;
   a fourth ground;
   a fifth ground;
   an output coupler including an RF output port, a second resistor and a sixth capacitor; the sixth capacitor connected between the RF output port of the output coupler and the eighth node;
   an output phase difference network of the output coupler including a first output DC bias injection network, a second output DC bias injection network and a seventh capacitor; the seventh capacitor connected in series with the second resistor between the tenth node and the second resistor;
   a fourth transmission line connected between the eighth node and the tenth node;
   a fifth transmission line connected between the eighth node and the ninth node;
   the second resistor connected between the seventh capacitor and the ninth node;
   a sixth transmission line connected between the tenth node and the second amplifier;
   an eighth capacitor connected between the eleventh node and the twelfth node;
   a third inductor connected between the eleventh node and the thirteenth node;
   a third DC bias injection port of the second output DC bias injection network connected to the thirteenth node;

a fourth DC bias injection port of the second output DC bias injection network connected to the fourteenth node;
a ninth capacitor connected between the thirteenth node and the fourth ground;
a fourth inductor connected between the twelfth node and the fourteenth node;
a tenth capacitor connected between the fourteenth node and the fifth ground;
the first amplifier connected to the twelfth node; and
the second amplifier connected to the sixth transmission line.

15. The RF power amplifier of claim 1, further comprising:
a first node;
a second node;
a third node;
a fourth node;
a fifth node;
a sixth node;
a seventh node;
a first ground;
a second ground;
an RF input port of the input coupler, the first capacitor connected between the RF input port of the input coupler and the first node;
a first transmission line connected between the first node and the second node;
a second transmission line connected between the first node and the third node;
the second capacitor connected between the second node and the first resistor;
the first resistor connected between the second capacitor and the third node;
a first output port of the input coupler;
a third transmission line connected between the second node and the first output port of the input coupler;
a third capacitor connected between the fourth node and the fifth node;
a first inductor connected between the fourth node and the sixth node;
a first DC bias injection port of the first input DC bias injection network connected to the sixth node;
a second input DC bias injection network including a second DC bias injection port, the second DC bias injection port connected to the seventh node;
a fourth capacitor connected between the sixth node and the first ground;
a second inductor connected between the fifth node and the seventh node;
a fifth capacitor connected between the seventh node and the second ground;
the first amplifier connected to the third transmission line; and
the second amplifier connected to the fifth node.

16. The RF power amplifier of claim 15, further comprising:
an eighth node;
a ninth node;
a tenth node;
an eleventh node;
a twelfth node;
a thirteenth node;
a fourteenth node;
a third ground;
a fourth ground;
an output coupler including an RF output port, a second resistor and a sixth capacitor; the sixth capacitor connected between the RF output port of the output coupler and the eighth node;
an output phase difference network of the output coupler including a first output DC bias injection network, a second output DC bias injection network and a seventh capacitor; the seventh capacitor connected in series with the second resistor between the tenth node and the second resistor;
a fourth transmission line connected between the eighth node and the tenth node;
a fifth transmission line connected between the eighth node and the ninth node;
the second resistor connected between the seventh capacitor and the ninth node;
a sixth transmission line connected between the tenth node and the second amplifier;
an eighth capacitor connected between the eleventh node and the twelfth node;
a third inductor connected between the eleventh node and the thirteenth node;
a third DC bias injection port of the second output DC bias injection network connected to the thirteenth node;
a fourth DC bias injection port of the second output DC bias injection network connected to the fourteenth node;
a ninth capacitor connected between the thirteenth node and the third ground;
a fourth inductor connected between the twelfth node and the fourteenth node;
a tenth capacitor connected between the fourteenth node and the fourth ground;
the first amplifier connected to the twelfth node; and
the second amplifier connected to the sixth transmission line.

17. The RF power amplifier of claim 1, further comprising:
a first node;
a second node;
a third node;
a fourth node;
a fifth node;
a sixth node;
a seventh node;
an eighth node;
a ninth node;
a first ground;
a second ground;
a third ground;
a fourth ground;
an RF input port of the input coupler, the first capacitor connected between the RF input port of the input coupler and the first node;
a first transmission line connected between the first node and the second node;
a second transmission line connected between the first node and the third node;
the second capacitor connected between the second node and the first resistor;
the first resistor connected between the second capacitor and the third node;
a first output port of the input coupler;
a third transmission line connected between the second node and the first output port of the input coupler;
a third capacitor connected between the fourth node and the fifth node;

a first inductor connected between the fourth node and the sixth node;

a first DC bias injection port of the first input DC bias injection network connected to the eighth node;

a second input DC bias injection network including a second DC bias injection port, the second DC bias injection port connected to the ninth node;

the sixth node connected to the seventh node;

a fourth capacitor connected between the sixth node and the first ground;

a first RF path crossing of the first input DC bias injection network between the second node and the third transmission line;

a second RF path crossing of the first input DC bias injection network between the third node and the fourth node;

a third RF path crossing of the second input DC bias injection network between the third transmission line and the first amplifier;

a fourth RF path crossing of the second input DC bias injection network between the sixth node and the second amplifier;

a second inductor connected between the fifth node and the seventh node;

a fifth capacitor connected between the seventh node and the second ground;

a sixth capacitor connected between the eighth node and the third ground;

a seventh capacitor connected between the ninth node and the fourth ground;

the first amplifier connected to the third transmission line; and the second amplifier connected to the fifth node.

18. The RF power amplifier of claim 17, further comprising:
a ninth node;
a tenth node;
an eleventh node;
a twelfth node;
a thirteenth node;
a fourteenth node;
a fifth ground;
a sixth ground;
an output coupler including an RF output port, a second resistor and a sixth capacitor; the sixth capacitor connected between the RF output port of the output coupler and the eighth node;
an output phase difference network of the output coupler including a first output DC bias injection network, a second output DC bias injection network and a seventh capacitor; the seventh capacitor connected in series with the second resistor between the tenth node and the second resistor;
a fourth transmission line connected between the eighth node and the tenth node;
a fifth transmission line connected between the eighth node and the ninth node;
the second resistor connected between the seventh capacitor and the ninth node;
a sixth transmission line connected between the tenth node and the second amplifier;
an eighth capacitor connected between the eleventh node and the twelfth node;
a third inductor connected between the eleventh node and the thirteenth node;
a third DC bias injection port of the second output DC bias injection network connected to the thirteenth node;
a fourth DC bias injection port of the second output DC bias injection network connected to the fourteenth node;
a ninth capacitor connected between the thirteenth node and the fifth ground;
a fourth inductor connected between the twelfth node and the fourteenth node;
a tenth capacitor connected between the fourteenth node and the sixth ground;
the first amplifier connected to the twelfth node; and
the second amplifier connected to the sixth transmission line.

19. An RF power amplifier comprising:
an input coupler comprising a first resistor and a first capacitor;
an input phase difference network of the input coupler comprising a first input direct current (DC) bias injection network and a second capacitor connected in series with the first resistor; wherein the second capacitor increases a bandwidth of the RF power amplifier;
a first power amplifier;
a second power amplifier; wherein the first input DC bias injection network provides power to the first power amplifier and the second power amplifier;
an output coupler comprising a second resistor and a third capacitor; and
an output phase difference network of the output coupler comprising a first output DC bias injection network, a second output DC bias injection network and a fourth capacitor connected in series with the second resistor; wherein the first input DC bias injection network is on a first side of the RF power amplifier and the first output DC bias injection network and the second output DC bias injection network are on an opposing side.

* * * * *